(12) United States Patent
Tanaka

(10) Patent No.: US 10,770,450 B2
(45) Date of Patent: Sep. 8, 2020

(54) SEMICONDUCTOR INTEGRATED CIRCUIT

(71) Applicant: FUJI ELECTRIC CO., LTD., Kawasaki-shi (JP)

(72) Inventor: Takahide Tanaka, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 85 days.

(21) Appl. No.: 16/170,509

(22) Filed: Oct. 25, 2018

(65) Prior Publication Data

US 2019/0189610 A1    Jun. 20, 2019

(30) Foreign Application Priority Data

Dec. 15, 2017   (JP) .................. 2017-240854

(51) Int. Cl.
| | | |
|---|---|---|
| *H01L 27/02* | (2006.01) | |
| *H01L 21/761* | (2006.01) | |
| *H03K 17/00* | (2006.01) | |
| *H01L 27/06* | (2006.01) | |
| *H01L 29/739* | (2006.01) | |
| *H01L 29/78* | (2006.01) | |
| *H01L 29/861* | (2006.01) | |

(52) U.S. Cl.
CPC ........ *H01L 27/0255* (2013.01); *H01L 21/761* (2013.01); *H01L 27/0629* (2013.01); *H03K 17/00* (2013.01); *H01L 29/7393* (2013.01); *H01L 29/7819* (2013.01); *H01L 29/7835* (2013.01); *H01L 29/8611* (2013.01)

(58) Field of Classification Search
CPC .................. H01L 27/0255; H01L 27/0629
See application file for complete search history.

(56) References Cited

U.S. PATENT DOCUMENTS

| | | | |
|---|---|---|---|
| 7,812,402 | B2 | 10/2010 | Hatade |
| 2006/0118860 | A1 | 6/2006 | Hatade |
| 2010/0109063 | A1 | 5/2010 | Hayashida |

FOREIGN PATENT DOCUMENTS

| | | |
|---|---|---|
| JP | 1-114077 A | 5/1989 |
| JP | 2006-165026 A | 6/2006 |
| JP | 2008-124205 A | 5/2008 |
| JP | 2010-109172 A | 5/2010 |

*Primary Examiner* — Douglas M Menz

(57) ABSTRACT

A semiconductor integrated circuit includes: a $p^-$-type semiconductor substrate defining a high-potential side circuit area and a low-potential side circuit area separated from each other; a high-side n well provided in an upper part of the semiconductor substrate in the high-potential side circuit area; a high-side p well provided in the high-side n well; and a p-type semiconductor region provided in an upper part of the semiconductor substrate in the low-potential side circuit area; and $n^+$-type semiconductor region provided to be brought contact with the p-type semiconductor region, wherein a whole n-type semiconductor region including the $n^+$-type semiconductor region, has an impurity concentration higher than an impurity concentration of the high-side n well.

5 Claims, 12 Drawing Sheets

SEMICONDUCTOR INTEGRATED CIRCUIT

CROSS-REFERENCE TO RELATED APPLICATION

This application claims benefit of priority under 35 USC 119 based on Japanese Patent Application No. 2017-240854 filed on Dec. 15, 2017, the entire contents of which are incorporated by reference herein.

BACKGROUND OF THE INVENTION

1. Field of the Invention

The present invention relates to a semiconductor integrated circuit for power such as a high-voltage IC (hereinafter, referred to as "HVIC"), which can be used as a control IC of a power switching element.

2. Description of the Related Art

Mainly in an inverter with low capacity, a power switching element of a bridge circuit for power conversion is driven and controlled by an HVIC. In accordance with an input signal from an input terminal, the HVIC outputs a drive signal from an output terminal so that a gate of the power switching element is turned into an on state or an off state, to thereby drive the power switching element. In the bridge circuit for power conversion, a high-voltage side power switching element (hereinafter, referred to as "high-voltage side switching element") and a low-voltage side power switching element (hereinafter, referred to as "low-voltage side switching element"), which receive the signal from the HVIC, are operated to perform power conversion.

The HVIC includes a low-side circuit area and a high-side circuit area. The low-side circuit area has GND potential as reference potential. The high-side circuit area has VS potential higher than the GND potential as reference potential, and is operated with VB potential higher than the VS potential as power potential. The HVIC has a function of converting an input signal with the GND potential as a reference into a signal with the VS potential as a reference and outputting the converted signal. With this function, gate driving of the low-voltage side switching element and the high-voltage side switching element and the like can be performed.

The low-side circuit area and the high-side circuit area of the HVIC are required to be electrically isolated from each other. Among several isolation methods, a self-isolation method in which isolation is performed at a p-n junction formed by diffusion is the most inexpensive method. In this method, a deep n-type diffusion layer (high-side n well) is formed in an upper part of a p-type substrate, and a p-type diffusion layer (high-side p well) is formed in an upper part of the high-side n well. In this case, the p-type substrate, the high-side n well, and the high-side p well are fixed to the GND potential, the VB potential, and the VS potential, respectively.

At the time of operation of the HVIC, a relationship of the VB potential>the VS potential≥the GND potential is satisfied, and no current flows to junctions of a parasitic p-n-p transistor including the high-side p well, the high-side n well, and the p substrate. However, when a relationship of the VS potential>the VB potential>the GND potential is caused by noise and the like, the parasitic transistor is turned into an on state, and large current flows from the p-type diffusion layer to the p-type substrate. When the relationship of the VB potential>the VS potential≥the GND potential is satisfied again, however, no current flows. Thus, the noise has a negligible influence on the IC operation as long as the noise is instantaneous.

However, in a case where a deep n-type diffusion layer (low-side n well) fixed to different potential is present in the same p-type substrate as the one described above, when part of the current of the above-mentioned parasitic p-n-p transistor flows in, a parasitic p-n-p-n thyristor is turned into an on state. In this case, a latch-up phenomenon may be induced. Even when the relationship of the VB potential>the VS potential≥the GND potential is satisfied again, the current is liable to continue flowing. Thus, even when the noise is instantaneous, the noise has a significant influence on the IC operation. As a simple method for suppressing the parasitic p-n-p-n thyristor operation, the low-side n well and the high-side p well are arranged so as to be separated from each other. However, with this method, a chip area is increased.

As another method for suppressing the parasitic thyristor operation, the following method is described in Japanese Unexamined Patent Application Publication No. Hei 1-114077 (Patent Literature 1). That is, specific elements such as gate protection diodes are formed through use of polycrystal silicon on an oxide film, and these elements are formed at positions to which no parasitic current flows. Further, in Japanese Unexamined Patent Application Publication No. 2006-165026 (Patent Literature 2), it is described that parasitic p-n-p transistor current causing the thyristor operation is reduced by forming an $n^+$ buried layer directly under a high-side n well. Further, in Japanese Unexamined Patent Application Publication No. 2008-124205 (Patent Literature 3), it is described that a trench deeper than a low-side n well is formed between the low-side n well and a region to which noise current is to be injected so as to suppress injection of the noise current to the low-side n well. Further, in Japanese Unexamined Patent Application Publication No. 2010-109172 (Patent Literature 4), it is described that the parasitic thyristor operation is suppressed by always fixing cathode potential of a parasitic p-n-p-n thyristor (corresponding to the potential of the low-side n well) to potential higher than the GND potential.

With the methods described in Patent Literatures 1 to 3, the parasitic thyristor operation can be suppressed while suppressing the increase of a chip area. However, process cost is increased. Further, with the method described in Patent Literature 4, effects are not exerted in a case where the potential of the low-side n well swings to the GND potential even instantaneously at the time of noise application.

In view of the above-mentioned problems, the present invention has an object to provide a semiconductor integrated circuit, which can suppress operation of a parasitic thyristor with a smaller chip area while suppressing increase of process cost.

SUMMARY OF THE INVENTION

An aspect of the present invention inheres in a semiconductor integrated circuit encompassing: a semiconductor substrate having a first conductivity type; a first well region having a second conductivity type, which is provided in an upper part of the semiconductor substrate in a high-potential side circuit area defined in the semiconductor substrate; a second well region having the first conductivity type, which is provided in an upper part of the first well region and has an impurity concentration higher than an impurity concentration of the semiconductor substrate; and a first semiconductor region having the second conductivity type, which is provided in a low-potential side circuit area, the low-potential side circuit area being separated from the high-potential side circuit area to be defined in the semiconductor substrate and being operated with potential as a reference, which is lower than reference potential of the high-potential side circuit area, wherein a whole semiconductor region having the second conductivity type, which includes the first semiconductor region, has an impurity concentration higher than an impurity concentration of the first well region.

Another aspect of the present invention inheres in a semiconductor integrated circuit encompassing: a semiconductor substrate having a first conductivity type; a first well region having a second conductivity type, which is provided in an upper part of the semiconductor substrate in a high-potential side circuit area defined in the semiconductor substrate; a second well region having the first conductivity type, which is provided in an upper part of the first well region and has an impurity concentration higher than an impurity concentration of the semiconductor substrate; a first semiconductor region having the second conductivity type, which has an impurity concentration higher than an impurity concentration of the first well region and is provided in a low-potential side circuit area, the low-potential side circuit area being separated from the high-potential side circuit area to be defined in the semiconductor substrate and being operated with potential as a reference, which is lower than reference potential of the high-potential side circuit area; and a third well region having the second conductivity type, which is provided to be separated from the first semiconductor region in the upper part of the semiconductor substrate in the low-potential side circuit area and has an impurity concentration equal to or lower than the impurity concentration of the first well region, wherein the first semiconductor region being arrange at a position relatively close to the high-potential side circuit area with respect to the third well region.

Further aspect of the present invention inheres in a semiconductor integrated circuit encompassing: a semiconductor substrate having a first conductivity type; a first well region having a second conductivity type, which is provided in an upper part of the semiconductor substrate in a high-potential side circuit area defined in the semiconductor substrate; a second well region having the first conductivity type, which is provided in an upper part of the first well region and has an impurity concentration higher than an impurity concentration of the semiconductor substrate; a first semiconductor region having the second conductivity type, which has an impurity concentration higher than an impurity concentration of the first well region and is provided in a low-potential side circuit area, the low-potential side circuit area being separated from the high-potential side circuit area to be defined in the semiconductor substrate and being operated with potential as a reference, which is lower than reference potential of the high-potential side circuit area; and a third well region having the second conductivity type, which is provided to be separated from the first semiconductor region in the upper part of the semiconductor substrate in the low-potential side circuit area and has an impurity concentration equal to or lower than the impurity concentration of the first well region, wherein an element, which is capable of being always applied with potential higher than substrate potential to be applied to the semiconductor substrate, is provided through use of the third well region, and an element, which is prevented from being always applied with the potential is provided through use of the first semiconductor region.

DESCRIPTION OF THE EMBODIMENTS

Figure 1:
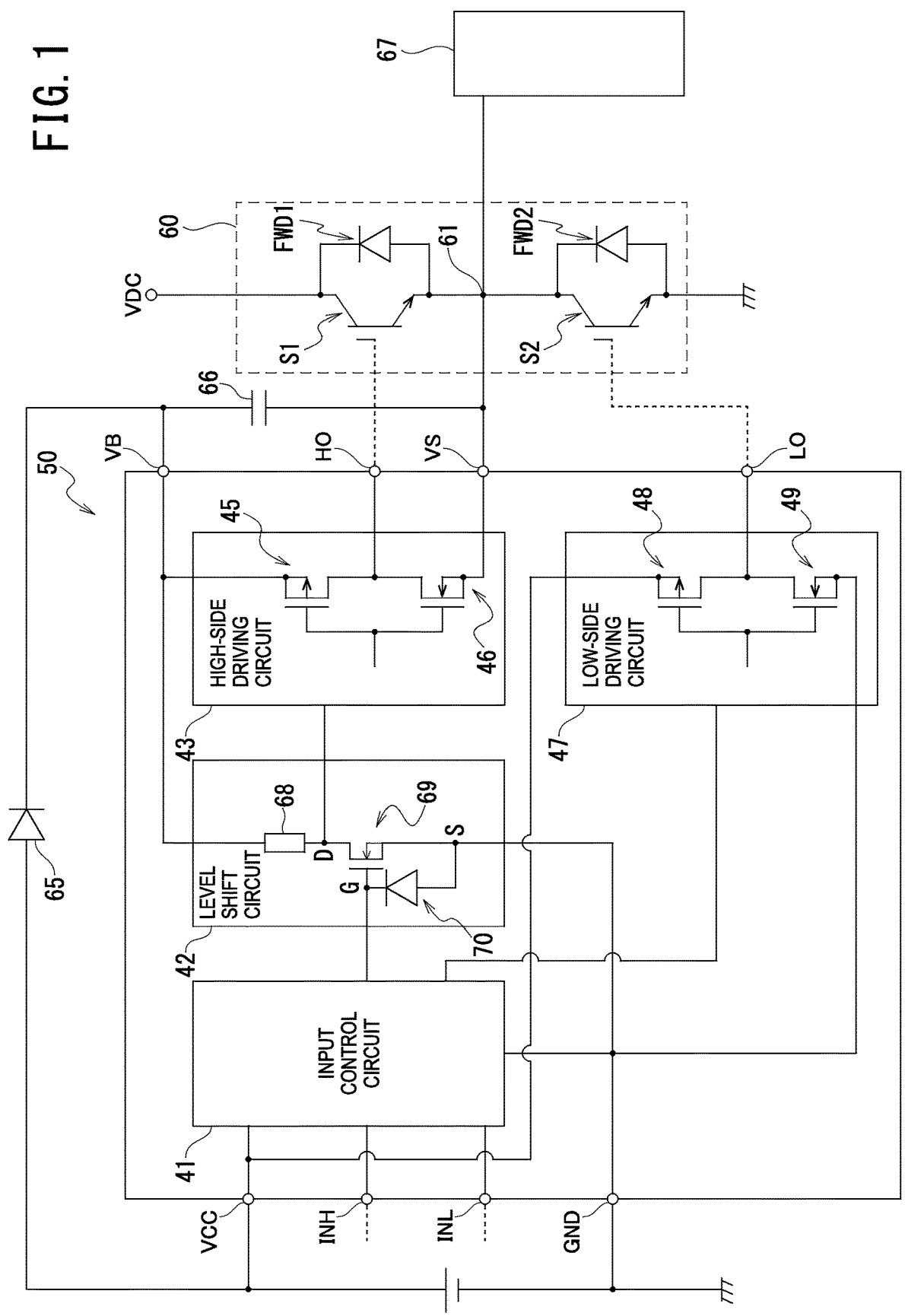
FIG. 1 is a circuit diagram for illustrating an example of a semiconductor integrated circuit according to a first embodiment of the present invention.

With reference to the Drawings, first to third embodiments of the present invention will be described below. In the Specification and the Drawings, the same or similar elements are indicated by the same or similar reference numerals. The drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions. The embodiments described below merely illustrate schematically semiconductor devices for specifying and giving shapes to the technical idea of the present invention, and the span of the technical idea is not limited to materials, shapes, structures, and relative positions of elements described herein.

In the Specification, a "first main-electrode region" is assigned to a semiconductor region which will be a source region or a drain region in a field-effect transistor (FET) or a static induction transistor (SIT), an emitter region or a collector region in an insulated-gate bipolar transistor (IGBT) and an anode region or a cathode region in a static induction (SI) thyristor or a gate turn-off (GTO) thyristor. A "second main-electrode region" is assigned to a semiconductor region which will not be the first main-electrode region and will be the source region or the drain region in the FET or the SIT, the emitter region or the collector region in the IGBT, and the anode region or the cathode region in the SI thyristor or the GTO thyristor. That is, when the first main-electrode region is the source region, the second main-electrode region means the drain region. When the first main-electrode region is the emitter region, the second main-electrode region means the collector region. When the first main-electrode region is the anode region, the second main-electrode region means the cathode region. In some appropriate cases, a function of the first main-electrode region and a function of the second main-electrode region are exchangeable each other by exchanging a bias relationship if the structure of the subject semiconductor device is symmetric. Furthermore, a "main-electrode region" is described in the Specification, the main-electrode region comprehensively means any one of the first main-electrode region and the second main-electrode region.

In this specification, description is made in the following manner. That is, as a "high electrode terminal", a drain terminal is selected in a MISFET and a MISSIT, and a collector terminal is selected in IGBT. In this case, as a "low electrode terminal", a source terminal is selected in the MISFET and the MISSIT, and an emitter terminal is selected in the IGBT. Further, in the MISFET, the MISSIT, and the IGBT, a "control terminal" corresponds to a gate terminal.

Further, definitions of directions such as an up- and down direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction. Further, in the following description, there is exemplified a case where a first conductivity type is an n type and a second conductivity type is a p type. However, the relationship of the conductivity types may be inverted to set the first conductivity type to the p type and the second conductivity type to the n type. Further, a semiconductor region denoted by the symbol "n" or "p" attached with "+" indicates that such semiconductor region has a relatively high impurity concentration as compared to a semiconductor region denoted by the symbol "n" or "p" without "+". A semiconductor region denoted by the symbol "n" or "p" attached with "−" indicates that such semiconductor region has a relatively low impurity concentration as compared to a semiconductor region denoted by the symbol "n" or "p" without "−". However, even when the semiconductor regions are denoted by the same reference symbols "n" and "n", it is not indicated that the semiconductor regions have exactly the same impurity concentration. Moreover, it is technically and logically obvious that the members and the regions that are limited by adding "first conductivity type" and "second conductivity type" in the following description indicate the members and the regions formed of semiconductor members without particular obvious limitations.

First Embodiment

As illustrated in FIG. 1, a semiconductor integrated circuit 50 according to a first embodiment of the present invention is a high-voltage resistant power IC configured to drive, for example, a power converter 60 as a subject to be driven, which is one phase of a bridge circuit for power conversion. The power converter 60 includes a high-voltage side switching element S1 and a low-voltage side switching element S2 connected to each other in series to implement an output circuit. In FIG. 1, there is exemplified a case where the high-voltage side switching element S1 and the low-voltage side switching element S2 are IGBTs. However, the high-voltage side switching element S1 and the low-voltage side switching element S2 are not limited to the IGBTs, and may be other power switching elements such as MOSFETs. A free wheel diode FWD1 is reversely connected to the high-voltage side switching element S1 in parallel, and a free wheel diode FWD2 is reversely connected to the low-voltage side switching element S2 in parallel. Note that, the high-voltage side switching element S1 and the free wheel diode FWD1, and the low-voltage side switching element S2 and the free wheel diode FWD2 may be replaced with reverse conducting IGBTs. For each of the reverse conducting IGBTs, an IGBT and an FWD are integrated on one chip.

The high-voltage side switching element S1 and the low-voltage side switching element S2 are connected to each other in series between a high-voltage main power supply VDC on the positive side and ground potential (GND potential) on the negative side being an opposite side of the main power supply VDC. In this manner, a half bridge circuit is implemented. A high electrode terminal (collector terminal) of the high-voltage side switching element S1 is connected to the main power supply VDC, and a low electrode terminal (emitter terminal) of the low-voltage side switching element S2 is connected to the GND potential. A connection point 61 provided between a low electrode terminal (emitter terminal) of the high-voltage side switching element S1 and a high electrode terminal (collector terminal) of the low-voltage side switching element S2 is an output point of the power converter 60 being one phase of the bridge circuit for power conversion. A load 67 such as a motor is connected to the connection point 61, and VS potential at a reference voltage terminal VS is supplied to the load 67.

In accordance with an input signal from a high-potential input terminal INH, the semiconductor integrated circuit 50 according to the first embodiment outputs a drive signal from an output terminal HO so that a gate of the high-voltage side switching element S1 is turned into an on state or an off state, to thereby drive the high-voltage side switching element S1. Moreover, in accordance with an input signal from a low-potential input terminal INL, the semiconductor integrated circuit 50 according to the first embodiment outputs a drive signal from an output terminal LO so that a gate of the low-voltage side switching element S2 is turned into an on state or an off state, to thereby drive the low-voltage side switching element S2.

The semiconductor integrated circuit 50 according to the first embodiment of the present invention includes at least an input control circuit 41, a level shift circuit 42, a high-side driving circuit 43, and a low-side driving circuit 47 as parts of the circuit. For example, the input control circuit 41, the level shift circuit 42, the high-side driving circuit 43, and the low-side driving circuit 47 may be integrated monolithically on a single semiconductor chip (semiconductor substrate). Alternatively, elements implementing the input control circuit 41, the level shift circuit 42, the high-side driving circuit 43, and the low-side driving circuit 47 may be integrated on two or more divided semiconductor chips.

The input control circuit 41 is operated with the GND potential to be applied to a ground terminal GND as reference potential and VCC potential to be applied to a power supply terminal VCC as power supply potential. In accordance with the input signal from the input terminal INH, the input control circuit 41 generates an on signal or an off signal at a low-side level for turning the high-voltage side switching element S1 into the on state or the off state, and outputs the generated signal to the level shift circuit 42. Moreover, in accordance with the input signal from the input terminal INL, the input control circuit 41 generates an on signal or an off signal at the low side level for turning the low-voltage side switching element S2, and outputs the generated signal to the low-side driving circuit 47. Although the illustration therefor is omitted, the input control circuit 41 includes, for example, a complementary MOS (CMOS) circuit for an nMOS transistor and a pMOS transistor.

The level shift circuit 42 is operated with the GND potential to be applied to the ground terminal GND as reference potential. The level shift circuit 42 converts the on signal or the off signal from the input control circuit 41 into an on signal or an off signal at a high-side level, which are to be used on the high side. The level shift circuit 42 includes an nMOS transistor 69 functioning as a level shifter. A gate terminal G of the nMOS transistor 69 is connected to the input control circuit 41. A source terminal S of the nMOS transistor 69 is connected to the ground terminal GND. A drain terminal D of the nMOS transistor 69 is connected to an input terminal of the high-side driving circuit 43. A level shift resistor 68 has one end connected to the drain terminal D of the nMOS transistor 69 and another end connected to a power supply terminal VB. A protection diode 70 is connected between the gate and the source of the nMOS transistor 69.

The high-side driving circuit 43 is operated with the VS potential to be applied to the reference voltage terminal VS as reference potential and VB potential being a first potential to be applied to the power supply terminal VB as the power supply potential. In accordance with the on signal or the off signal from the level shift circuit 42, the high-side driving circuit 43 outputs a drive signal from the output terminal HO to drive the gate of the high-voltage side switching element S1. To an output stage, the high-side driving circuit 43 includes a CMOS circuit for, for example, an nMOS transistor 46 as a first active element and a pMOS transistor 45 as a second active element. A source terminal of the pMOS transistor 45 is connected to the power supply terminal VB. A source terminal of the nMOS transistor 46 is connected to the reference voltage terminal VS. The output terminal HO is connected between a drain terminal of the pMOS transistor 45 and a drain terminal of the nMOS transistor 46.

The low-side driving circuit 47 is operated with the GND potential to be applied to the ground terminal GND as reference potential and the VCC potential to be applied to a power supply voltage terminal VCC as the power supply potential. In accordance with the on signal or the off signal from the input control circuit 41, the low-side driving circuit 47 outputs a drive signal from the output terminal LO to drive the gate of the low-voltage side switching element S2. To an output stage, the low-side driving circuit 47 includes a CMOS circuit for, for example an nMOS transistor 49 as a first active element and a pMOS transistor 48 as a second active element. A source terminal of the pMOS transistor is connected to the power supply terminal VCC. A source terminal of the nMOS transistor 49 is connected to the ground terminal GND. The output terminal LO is connected between a drain terminal of the pMOS transistor 48 and a drain terminal of the nMOS transistor 49.

As the semiconductor integrated circuit 50 according to the first embodiment of the present invention, a bootstrap circuit is exemplified. A bootstrap diode 65 as an external element is connected between the power supply terminal VCC and the power supply terminal VB. A bootstrap capacitor 66 as an external element is connected between the power supply terminal VB and the reference voltage terminal VS. The bootstrap diode 65 and the bootstrap capacitor 66 form parts of the circuit of the drive power supply for the high-voltage side switching element S1.

The VB potential is the highest potential to be applied to the semiconductor integrated circuit 50, and is kept higher than the VS potential by approximately 15 V at the bootstrap capacitor 66 in a normal state without influence of noise. The high-voltage side switching element S1 and the low-voltage side switching element S2 are complementarily turned into the on state and the off state. With this, the VS potential is repeatedly raised and lowered within a range from low potential (the GND potential) to high potential (for example, approximately 400 V) of the main power supply VDC, and is changed within a range from 0 V to several hundred V. The VS potential may be negative potential.

Figure 2:
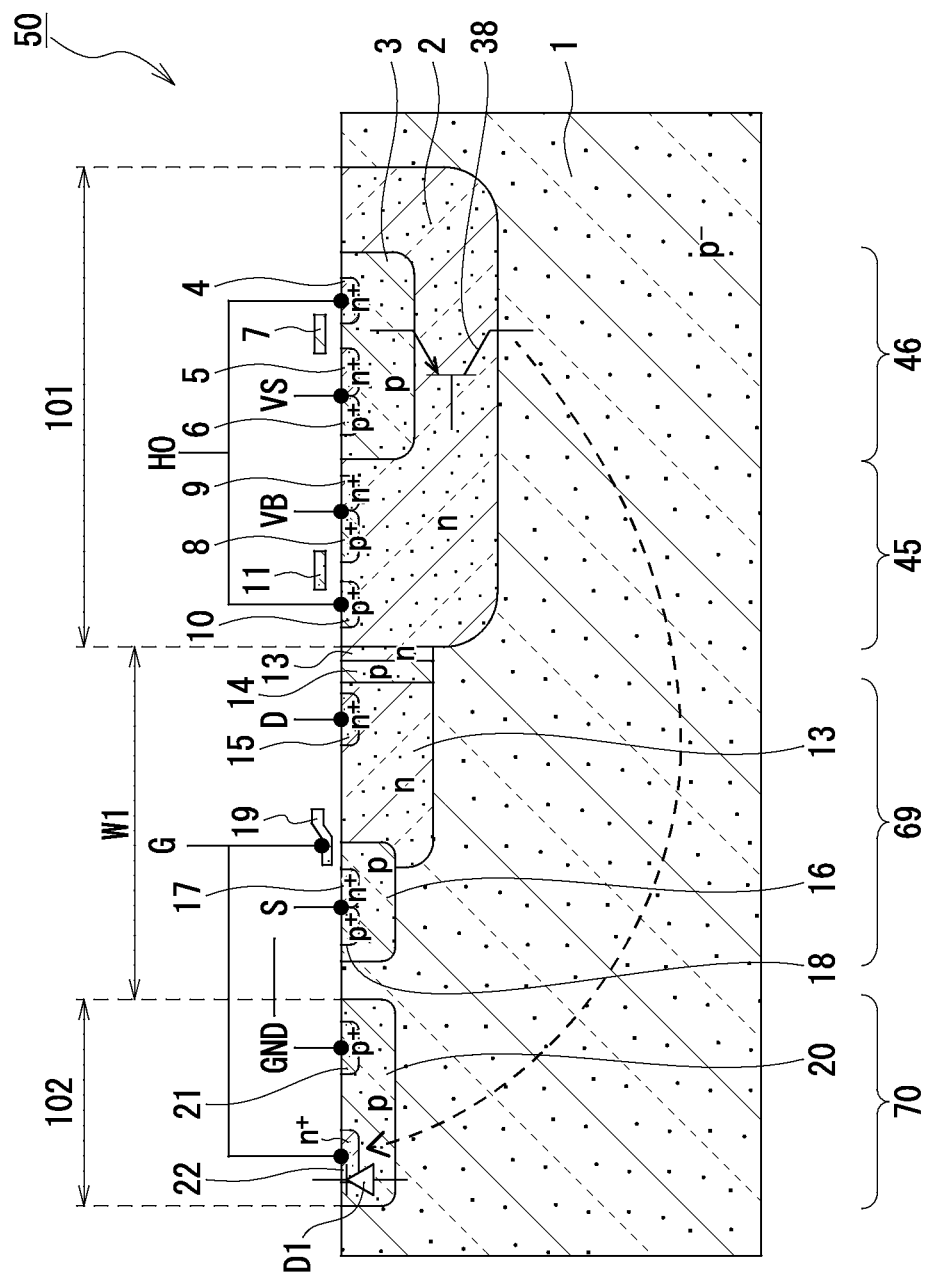
FIG. 2 is a sectional view for illustrating the example of the semiconductor integrated circuit according to the first embodiment.

Next, description is made of the specific structure of the semiconductor integrated circuit 50 according to the first embodiment. As illustrated in FIG. 2, in the semiconductor integrated circuit 50 according to the first embodiment, the power IC is formed of an element isolation structure manufactured through a self-isolation type IC process in a first conductivity type (p⁻-type) semiconductor substrate 1. As the semiconductor substrate 1, for example, a high-resistivity single crystal silicon substrate having resistivity of approximately 100 Ωcm or more is used. The semiconductor substrate 1 has an impurity concentration of, for example, approximately $1 \times 10^{14}$ cm$^{-3}$. Although the illustration therefor is omitted, a lower surface of the semiconductor substrate 1 is not fixed to potential, and is arranged in a package (not shown) through intermediation of an insulating adhesive. The lower surface of the semiconductor substrate 1 may be fixed to the GND potential. However, when the lower surface of the semiconductor substrate 1 is not fixed to potential, thermorunaway due to an operation of a parasitic p-n-p transistor (parasitic p-n-p transistor 38 to be described later) causing a parasitic thyristor operation can be suppressed. Further, when the lower surface of the semiconductor substrate 1 is not fixed to potential, an amount of the current flowing into an upper surface side of the semiconductor substrate 1 is increased due to the operation of the parasitic p-n-p transistor. Accordingly, the parasitic thyristor operation is liable to be caused. Thus, the invention of the present application is more effective in a case where the lower surface of the semiconductor substrate 1 is not fixed to potential.

The semiconductor integrated circuit 50 according to the first embodiment includes a high-potential side circuit area (high-side circuit area) 101 and a low-potential side circuit area (low-side circuit area) 102 on one chip. The high-side circuit area 101 is defined in the semiconductor substrate 1, and is operated with the VS potential as reference potential. The low-side circuit area 102 is defined in the semiconductor substrate 1 while electrically being separated from the high-side circuit area 101, and is operated with the GND potential as reference potential.

The pMOS transistor 45 and the nMOS transistor 46 of the high-side driving circuit 43 illustrated in FIG. 1 are provided in the high-side circuit area 101. The protection diode 70 of the level shift circuit 42 illustrated in FIG. 1 is provided in the low-side circuit area 102. The low-side circuit area 102 is separated from the high-side circuit area 101 by a distance W1 across the semiconductor substrate 1. The distance W1 is suitably adjustable. The nMOS transistor 69 of the level shift circuit 42 illustrated in FIG. 1 is provided between the high-side circuit area 101 and the low-side circuit area 102. The nMOS transistor 69 is provided adjacent to the high-side circuit area 101, and is fixed at a position relative to the high-side circuit area 101.

As illustrated in FIG. 2, in the high-side circuit area 101, a first well region (high-side n well) 2 having the second conductivity type (n-type) is selectively provided in an upper part of the semiconductor substrate 1. A second well region (high-side p well) 3 having the second conductivity type (p type) is selectively provided in an upper part of the first well region 2. The first well region 2 has an impurity concentration of, for example, approximately $1 \times 10^{16}$ cm$^{-3}$. The second well region 3 has an impurity concentration higher than the impurity concentration of the semiconductor substrate 1, which is, for example, approximately $1 \times 10^{17}$ cm$^{-3}$.

The pMOS transistor 45 is provide in the upper part of the high-side n well 2. Further, the nMOS transistor 46 is provided in an upper part of the high-side p well 3. Specifically, the high-side n well 2 is an isolation region for electrically isolating the pMOS transistor 45 from the p-type semiconductor substrate 1, and the high-side p well 3 is an isolation region for electrically isolating the nMOS transistor 46 from the high-side n well 2.

The nMOS transistor 46 includes an n$^+$-type first main electrode region (source region) 5 and an n$^+$-type second main electrode region (drain region) 4. The source region 5 is selectively provided in the upper part of the high-side p well 3. The drain region 4 is selectively provided in the upper part of the high-side p well 3, and is separated from the source region 5 across the high-side p well 3. The nMOS transistor 46 further includes a p$^+$-type contact region 6 provided to be brought contact with the source region 5 in the upper part of the high-side p well 3.

The source region 5 and the drain region 4 have an impurity concentration higher than the impurity concentration of the high-side n well 2, which is, for example, approximately from $1 \times 10^{20}$ cm$^{-3}$ to $1 \times 10^{21}$ cm$^{-3}$. The contact region 6 has an impurity concentration higher than the impurity concentration of the high-side p well 3, which is, for example, approximately from $1 \times 10^{20}$ cm$^{-3}$ to $1 \times 10^{21}$ cm$^{-3}$. The reference voltage terminal VS is connected to the source region 5 and the contact region 6. The output terminal HO is connected to the drain region 4.

The nMOS transistor 46 further includes a gate electrode 7 arranged to extend from a part above the drain region 4 to a part above the source region 5 through intermediation of a gate insulating film (not shown). The gate insulating film may be formed by, for example, a silicon oxide film (SiO$_2$ film), a silicon nitride film (Si$_3$N$_4$ film), and a lamination film including the silicon nitride film and the silicon oxide film. The gate electrode 7 is formed of, for example, a polycrystal silicon film in which impurities are doped.

Meanwhile, the pMOS transistor 45 includes a p$^+$-type first main electrode region (source region) 8 and a p$^+$-type second main electrode region (drain region) 10. The source region 8 is selectively provided in the upper part of the high-side n well 2. The drain region 10 is selectively provided in the upper part of the high-side n well 2, and is separated from the source region 8 across the high-side n well 2. The pMOS transistor 45 further includes an n$^+$-type contact region 9 provided to be brought contact with the source region 8 in the upper part of the high-side n well 2.

The source region 8 and the drain region 10 have an impurity densities higher than the impurity concentration of the high-side p well 3, which is, for example, approximately from $1 \times 10^{20}$ to $1 \times 10^{21}$. The contact region 9 has an impurity concentration higher than the impurity concentration of the high-side n well 2, which is, for example, approximately from $1 \times 10^{20}$ to $1 \times 10^{21}$. The power supply terminal VB is connected to the source region 8 and the contact region 9. The output terminal HO is connected to the drain region 10.

The pMOS transistor 45 further includes a gate electrode 11 arranged to extend from a part above the drain region 10 to a part above the source region 8 through intermediation of a gate insulating film (not shown). The gate insulating film may be formed by, for example, a silicon oxide film (SiO$_2$ film), a silicon nitride film (Si$_3$N$_4$ film), and a lamination film including the silicon nitride film and the silicon oxide film. The gate electrode 11 is formed of, for example, a polycrystal silicon film in which impurities are doped.

Further, the nMOS transistor 69 includes an n-type drift region 13 and an n$^+$-type first main electrode region (drain region) 15. The drift region 13 is selectively provided in the upper part of the semiconductor substrate 1. The drain region 15 is selectively provided in an upper part of the drift region 13. The drift region 13 is isolated from the high-side n well 2 by a p-type isolation region 14. The isolation region 14 has an impurity concentration higher than the impurity concentration of the semiconductor substrate 1, which is, for example, approximately $1 \times 10^{16}$ cm$^{-3}$.

The nMOS transistor 69 further includes a p-type base region 16 and an n$^+$-type second main electrode region (source region) 17. The base region 16 is provided to be brought contact with the drift region 13 in the upper part of the semiconductor substrate 1. The source region 17 is selectively provided in an upper part of the base region 16. A p$^+$-type base contact region 18 is provided to be brought contact with the source region 17 in the upper part of the base region 16. A low-potential electrode terminal (source terminal) S is connected to the source region 17 and the base contact region 18. The source terminal S has the same potential as that of the ground terminal GND. A high-potential electrode terminal (drain terminal) D is connected to the drain region 15.

The drift region 13 has an impurity concentration lower than, for example, the impurity concentration of the high-side n well 2, which is approximately $1 \times 10^{15}$ cm$^{-3}$. The drain region 15 and the source region 17 have an impurity concentration higher than the impurity concentration of the drift region 13, which is, for example, approximately $1 \times 10^{21}$ cm$^{-3}$. The base region 16 has an impurity concentration higher than, for example the impurity concentration of the semiconductor substrate 1, which is approximately $1 \times 10^{17}$ cm$^{-3}$. The base contact region 18 has an impurity concentration higher than the impurity concentration of the base region 16, which is approximately from $1 \times 10^{20}$ to $1 \times 10^{21}$ cm$^{-3}$.

The nMOS transistor 69 further includes a gate electrode 19 arranged to extend from a part above the source region 17 to a part above the drift region 13 across the base region 16 through intermediation of a gate insulating film (not shown). A control terminal (gate terminal) G is connected to the gate electrode 19. The gate insulating film may be formed by, for example, a silicon oxide film (SiO$_2$ film), a silicon nitride film (Si$_3$N$_4$ film), and a lamination film including the silicon nitride film and the silicon oxide film. The gate electrode 19 is formed of, for example, a polycrystal silicon film in which impurities are doped.

Meanwhile, in the low-side circuit area 102, the protection diode 70 includes a p-type second semiconductor region (drift region) 20 provided in the upper part of the semiconductor substrate 1. The protection diode 70 further includes a p$^+$-type first main electrode region (anode region) 21 and a first semiconductor region (cathode region) 22 as an n$^+$-type second main electrode region, which are provided in an upper part of the second semiconductor region 20 across the second semiconductor region 20. The ground terminal GND is connected to the anode region 21. The control terminal G is connected to the first semiconductor region 22.

The second semiconductor region 20 has an impurity concentration higher than the impurity concentration of the semiconductor substrate 1, which is, for example, approximately $1\times10^{18}$ cm$^{-3}$. The anode region 21 has an impurity concentration higher than the impurity concentration of the second semiconductor region 20, which is, for example, approximately from $1\times10^{20}$ cm$^{-3}$ to $1\times10^{21}$ cm$^{-3}$. The first semiconductor region 22 has an impurity concentration higher than the impurity concentration of the high-side n well 2, which is, for example, approximately from $1\times10^{20}$ cm$^{-3}$ to $1\times10^{21}$ cm$^{-3}$.

In the semiconductor integrated circuit 50 according to the first embodiment, when an n-type well region (low-side n well region) is provided in the low-side circuit area 102, the low-side n well region does not have an impurity concentration equal to or lower than the impurity concentration of the n-type high-side n well 2. Specifically, the whole n-type semiconductor region of the low-side circuit area 102, which includes the n$^+$-type first semiconductor region 22, has the impurity concentration higher than the impurity concentration of the n-type high-side n well 2. Here, there is exemplified a case where the n$^+$-type first semiconductor region 22 is the only n-type semiconductor region of the low-side circuit area 102. However, when the low-side circuit area 102 includes n-type semiconductor regions implementing other elements, the n-type semiconductor regions have an impurity concentration higher than that of the n-type high-side n well 2.

Figure 3:
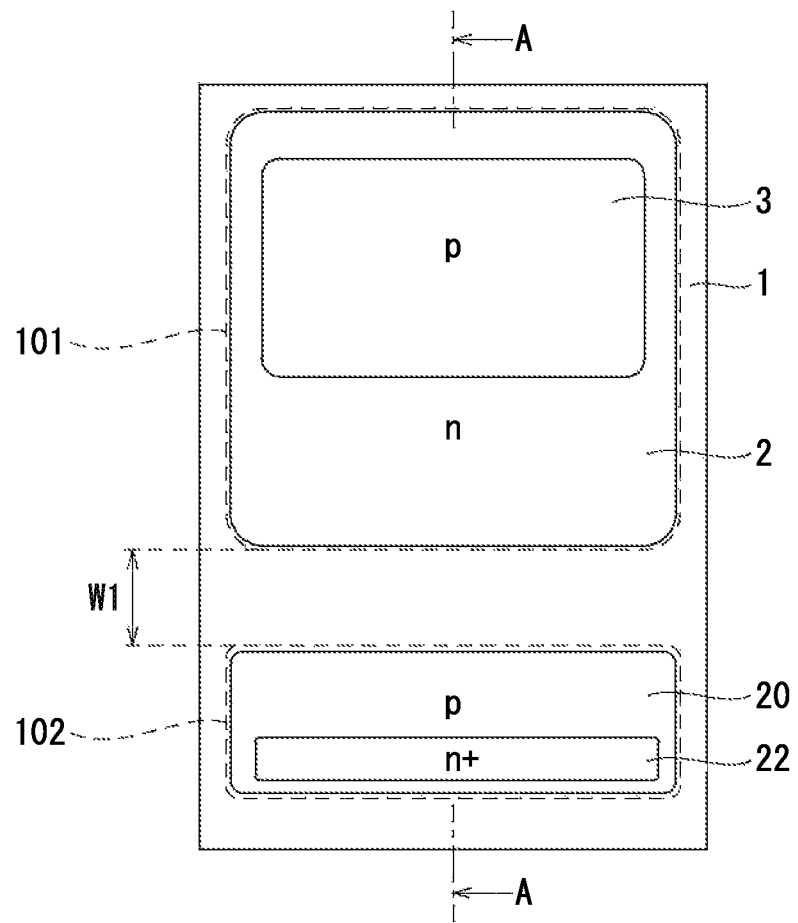
FIG. 3 is a plan view for illustrating the example of the semiconductor integrated circuit according to the first embodiment.

FIG. 3 is a schematic plan view for illustrating the semiconductor integrated circuit 50 according to the first embodiment. A sectional view taken along the line A-A of FIG. 3 corresponds to FIG. 2. In FIG. 3, a plane pattern of the n-type high-side n well 2 and the p-type high-side p well 3 of the high-side circuit area 101 and a plane pattern of the p-type second semiconductor region 20 and the n$^+$-type first semiconductor region 22 of the low-side circuit area 102 are schematically illustrated, and a planer pattern of the other regions is omitted.

As illustrated in FIG. 2, in the high-side circuit area 101 of the semiconductor integrated circuit 50 according to the first embodiment, the parasitic p-n-p bipolar transistor 38 including the high-side p well 3, the high-side n well 2, and the p$^-$-type semiconductor substrate 1 is formed. A base terminal, an emitter terminal, and a collector terminal of the parasitic p-n-p bipolar transistor 38 are connected to the power supply terminal VB, the reference voltage terminal VS, and the ground terminal GND, respectively.

During the normal operation of the semiconductor integrated circuit 50 according to the first embodiment, the VB potential is higher than the VS potential. Thus, the parasitic p-n-p bipolar transistor 38 is not operated. However, when the VB potential is lower than the VS potential due to surge current by a value of diffusion potential at a p-n junction interface of silicon, which is a value of 0.6 V or more, that is, when a potential relationship of the VB potential<(the VS potential−0.6 [V]) is satisfied, the parasitic p-n-p bipolar transistor 38 is turned into an on state. As indicated by the dashed-line arrow of FIG. 2, the following case is assumed. That is, part of collector current of the parasitic p-n-p bipolar transistor 38 arrives at the n$^+$-type first semiconductor region (cathode region) 22, and a parasitic diode D1, which is formed of the n$^+$-type first semiconductor region 22 and the p-type second semiconductor region 20, is turned into an on state. In this case, a parasitic p-n-p-n thyristor, which is formed of the high-side p well 3, the high-side n well 2, the p$^-$-type semiconductor substrate 1, the p-type second semiconductor region 20, the n$^+$-type first semiconductor region 22, is operated.

Figure 4:
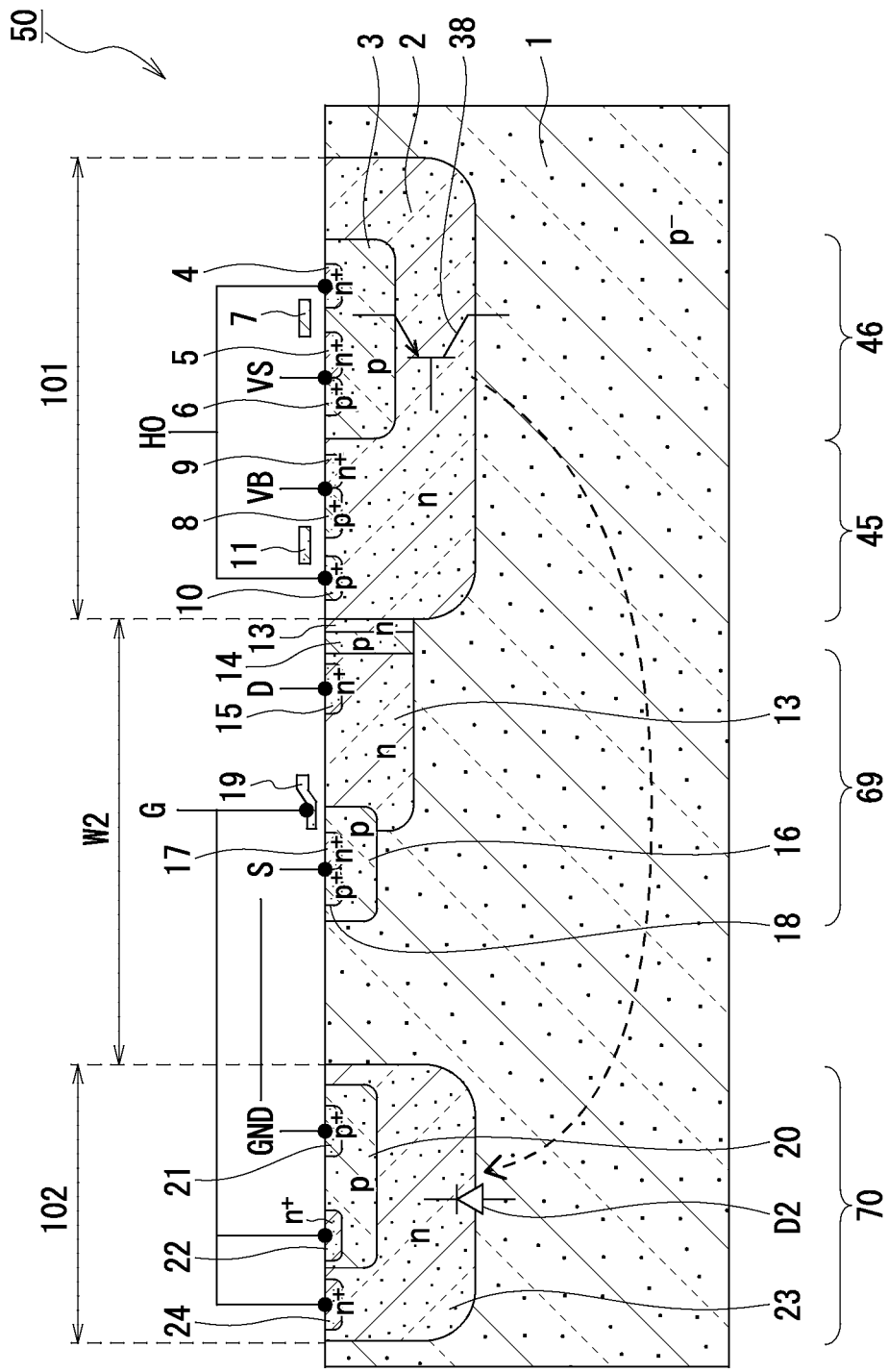
FIG. 4 is a sectional for illustrating a semiconductor integrated circuit as a comparative example in the first embodiment.
Figure 5:
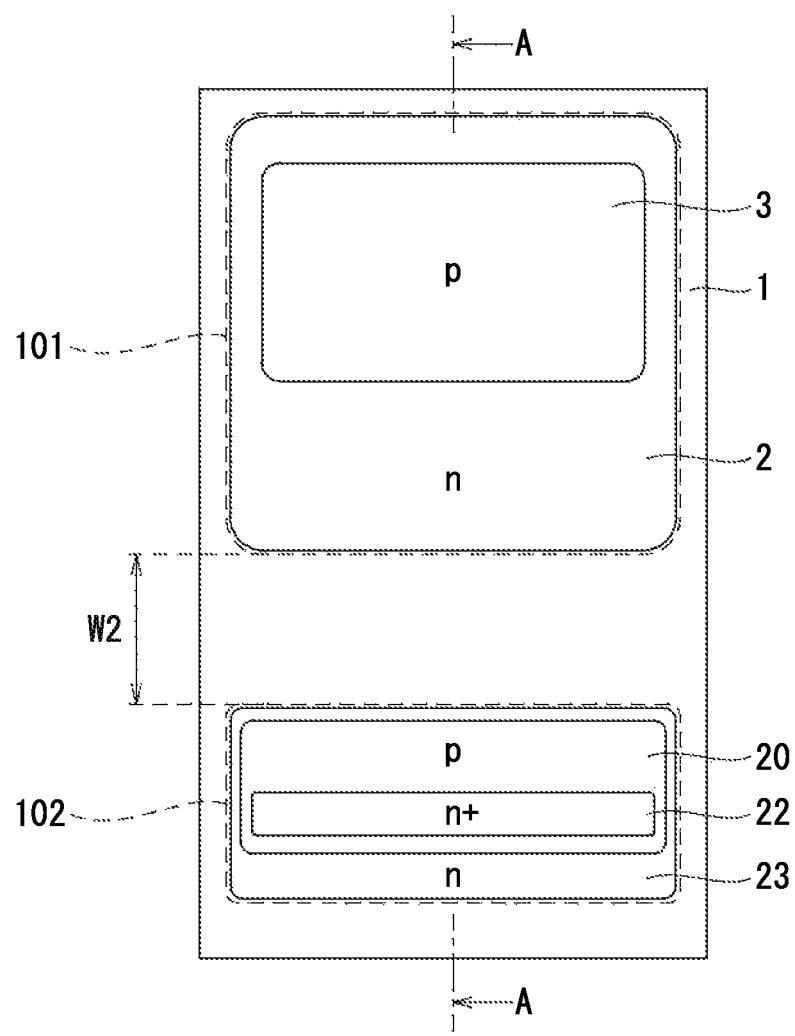
FIG. 5 is a plan view for illustrating the semiconductor circuit as the comparative example in the first embodiment.

Now, with reference to FIG. 4 and FIG. 5, description is made of a semiconductor integrated circuit as a comparative example in the first embodiment. As illustrated in FIG. 4, the semiconductor integrated circuit as the comparative example in the first embodiment is different from the semiconductor integrated circuit according to the first embodiment, which is illustrated in FIG. 1, in that an n-type third well region (low-side n well) 23 is provided in the low-side circuit area 102. The low-side n well 23 has an impurity concentration equal to or lower than the impurity concentration of the high-side n well 2, which is, for example, approximately $1\times10^{16}$ cm$^{-3}$. The low-side n well 23 is provided to have the same depth as that of the high-side n well 2. The low-side n well 23 may be formed by the same process as in the case of the high-side n well 2.

The protection diode 70 includes the p-type second semiconductor region (drift region) 20, the p$^+$-type anode region 21, and the n$^+$-type first semiconductor region (first cathode region) 22. The p-type second semiconductor region 20 is provided in an upper part of the low-side n well 23. The anode region 21 and the first semiconductor region 22 are provided in the upper part of the second semiconductor region 20, and have the impurity concentration higher than that of the second semiconductor region 20. An n$^+$-type second cathode region 24 having the same potential as that of the first semiconductor region 22 is provided in the low-side n well 23.

FIG. 5 is a schematic plan view for illustrating the semiconductor integrated circuit as the comparative example in the first embodiment. A sectional view taken along the line A-A of FIG. 5 corresponds to FIG. 4. In FIG. 5, a plane pattern of the high-side n well 2 and the high-side p well 3 of the high-side circuit area 101 and a plane pattern of the p-type second semiconductor region 20, the n$^+$-type first semiconductor region (cathode region) 22, and the low-side n well 23 of the low-side circuit area 102 are schematically illustrated, and a plane patter of the other regions is omitted.

In the semiconductor integrated circuit as the comparative example in the first embodiment, as illustrated in FIG. 4, the parasitic p-n-p bipolar transistor 38 are formed of the high-side p well 3, the high-side n well 2, and the p$^-$-type semiconductor substrate 1. The following case is assumed. That is, at the time of a normal operation of the semiconductor integrated circuit as the comparative example in the first embodiment, part of collector current of the parasitic p-n-p bipolar transistor 38 (indicated by the dashed-line arrow) flows in the low-side n well 23, and a parasitic diode D2, which is formed of the semiconductor substrate 1 and the low-side n well 23, is turned into an on state. In this case, a parasitic p-n-p-n thyristor, which is formed of the high-side p well 3, the high-side n well 2, the p⁻-type semiconductor substrate 1, and the n-type low-side n well 23, is operated.

In order to prevent the parasitic diode D1 of the semiconductor integrated circuit 50 according to the first embodiment and the parasitic diode D2 of the semiconductor integrated circuit as the comparative example in the first embodiment from being turned into the on state, it is required to prevent voltage drop caused by the current from exceeding built-in potential of the parasitic diodes D1 and D2.

Figure 6:
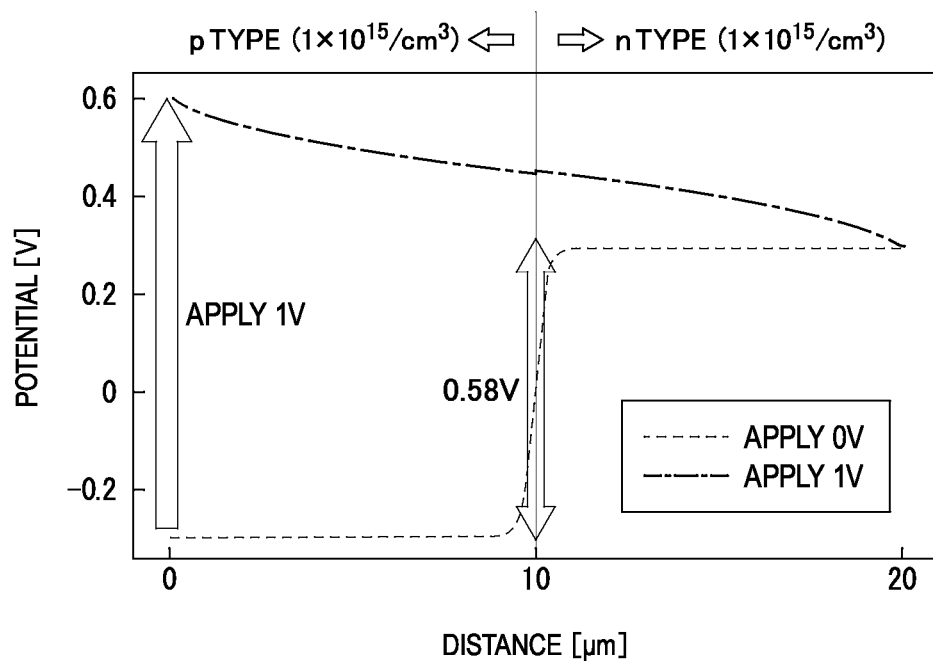
FIG. 6 is a graph for showing a relationship between a distance from a surface of a p-type semiconductor and potential when current of 0 V or current of 1 V is applied to a p-n junction diode.
Figure 7:
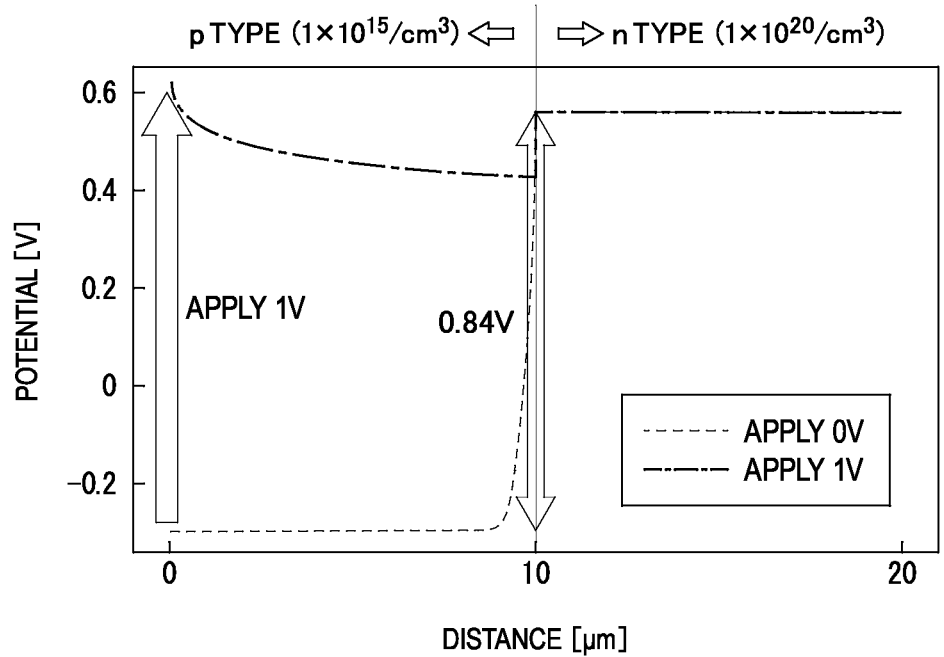
FIG. 7 is a graph for showing a relationship between a distance from a surface of a p-type semiconductor and potential when the current of 0 V or the current of 1 V is applied to the p-n junction diode.

Now, a graph for showing a relationship between a surface from a junction surface and potential when current of 0 V or current of 1 V is applied to a p-n junction diode is shown in each of FIG. 6 and FIG. 7. As shown in FIG. 6, when the p-n junction diode is formed of an n-type diffusion layer having an impurity concentration of $1 \times 10^{15}$ cm⁻³ and a p-type diffusion layer having an impurity concentration of $1 \times 10^{15}$ cm⁻³, built-in potential of the p-n junction diode is 0.58 V. Meanwhile, as shown in FIG. 7, when the p-n junction diode is formed of an n-type diffusion layer having an impurity concentration of $1 \times 10^{20}$ cm⁻³, which is higher than the impurity concentration of the n-type diffusion layer shown in FIG. 6, and a p-type diffusion layer having an impurity concentration of $1 \times 10^{15}$ cm⁻³, built-in potential of the p-n junction diode is 0.84 V. Specifically, as the n-type diffusion layer of the p-n junction diode becomes higher, the built-in potential of the p-n junction diode becomes higher.

As described in FIG. 4 and FIG. 5, in the semiconductor integrated circuit as the comparative example in the first embodiment, the low-side n well 23 is used for the low-side circuit area 102, and hence the built-in potential of the parasitic diode D2 is lower than that of the parasitic diode D1 of the semiconductor integrated circuit 50 according to the first embodiment. In view of this, in order to prevent the parasitic diode D2 from being turned into the on state, it is required to separate the low-side n well 23 from the high-side n well 2 to reduce an amount of current arriving at the low-side n well 23 from the parasitic p-n-p bipolar transistor 38. Therefore, as illustrated in FIG. 4 and FIG. 5, a distance W2 (for example, approximately 500 μm) between the high-side circuit area 101 and the low-side circuit area 102 is increased. Accordingly, the chip area is increased.

In contrast, with the semiconductor integrated circuit 50 according to the first embodiment, as illustrated in FIG. 2 and FIG. 3, the low-side n well 23 is not used for the low-side circuit area 102, and the whole n-type semiconductor region, which includes the first semiconductor region 22, has the impurity concentration higher than that of the high-side n well 2. In view of this, the built-in potential of the parasitic diode D1 formed of the n⁺-type first semiconductor region (cathode region) 22 is higher than that of the parasitic diode D2 of the semiconductor integrated circuit as the comparative example in the first embodiment. Thus, the parasitic diode D1 is less liable to be turned into the on state. Thus, as illustrated in FIG. 2 and FIG. 3, the n⁺-type first semiconductor region 22 can be arranged closed to the high-side n well 2, and hence the distance W1 between the high-side circuit area 101 and the low-side circuit area 102 can be reduced. Therefore, the operation of the parasitic p-n-p-n thyristor can be suppressed with a smaller chip area while suppressing increase of process cost.

Second Embodiment

Figure 8:
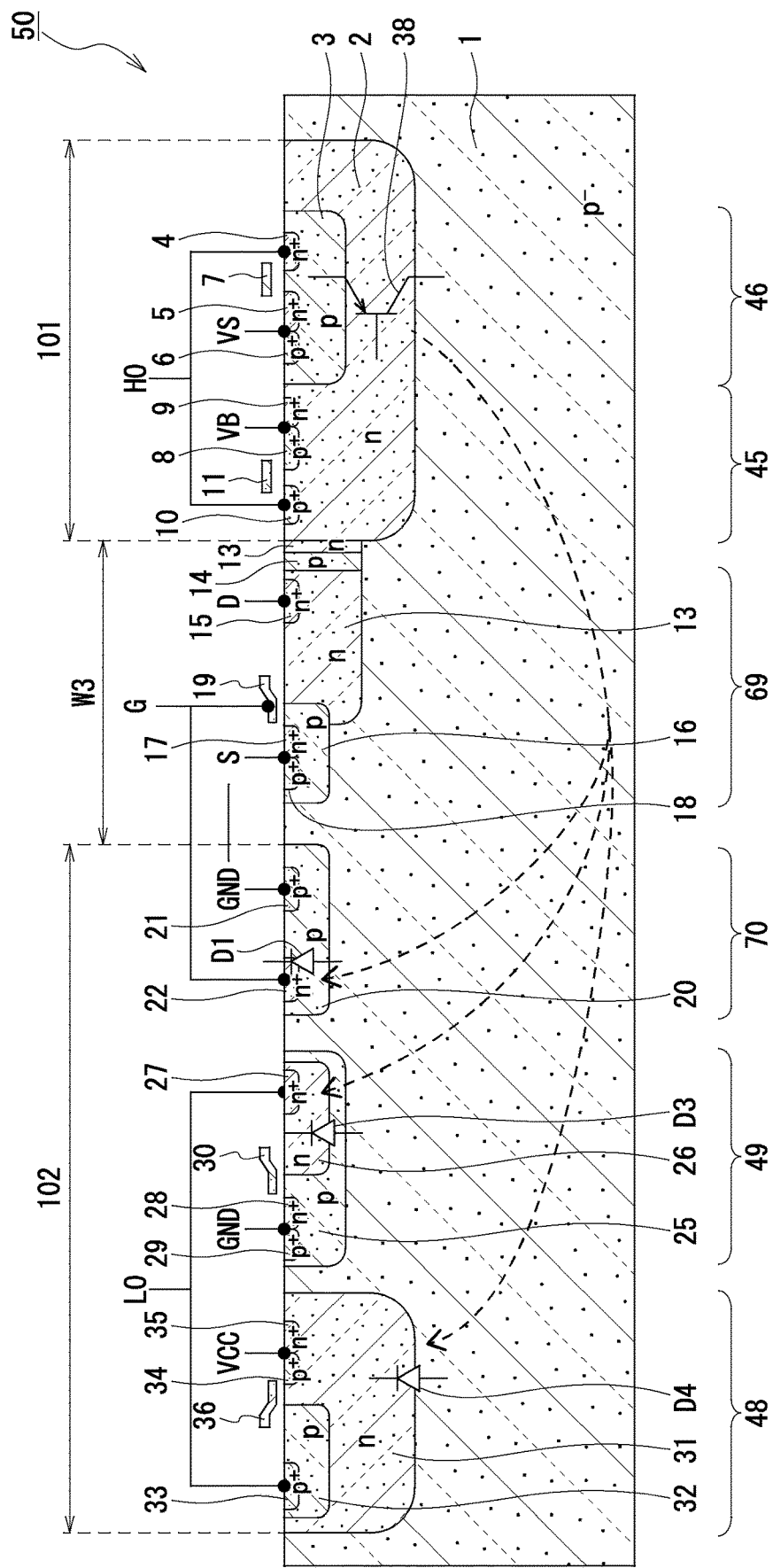
FIG. 8 is a sectional view for illustrating an example of a semiconductor integrated circuit according to a second embodiment of the present invention.

A circuit structure of a semiconductor integrated circuit according to a second embodiment of the present invention is the same as the circuit structure of the semiconductor integrated circuit according to the embodiment illustrated in FIG. 1. As illustrated in FIG. 8, the semiconductor integrated circuit according to the second embodiment includes the high-side circuit area 101 and the low-side circuit area 102 on one chip. The high-side circuit area 101 is operated with the VS potential as reference potential, and the low-side circuit area 102 is operated with the GND potential as reference potential. The semiconductor integrated circuit according to the second embodiment is different from the semiconductor integrated circuit according to the first embodiment in that, in addition to the protection diode 70 of the level shift circuit 42 illustrated in FIG. 1, the pMOS transistor 48 and the nMOS transistor 49 of the low-side driving circuit 47 illustrated in FIG. 1 is provided in the low-side circuit area 102.

In the low-side circuit area 102, the protection diode 70 includes the p-type second semiconductor region (drift region) 20 provided in the upper part of the semiconductor substrate 1. In the upper part of the second semiconductor region 20, the protection diode 70 further includes the p+-type anode region 21 and the n⁺-type first semiconductor region (cathode region) 22 provided across the second semiconductor region 20. The structure of the protection diode 70 is the same as that of the semiconductor integrated circuit according to the first embodiment, and hence the overlapping description therefor is omitted.

The nMOS transistor 49 includes a p-type base region 25, and n-type offset region 26, and an n⁺-type drain region 27. The base region 25 is provided in the upper part of the semiconductor substrate 1. The offset region 26 is provided in an upper part of the base region 25. The drain region 27 is provided in an upper part of the offset region 26. The nMOS transistor 49 further includes an n⁺-type source region 28 and a p⁺-type contact region 29. The source region 28 is provided to be separated from the offset region 26 in the upper part of the base region 25. The contact region 29 is provided to be brought contact with the source region 28 in the upper part of the base region 25. The nMOS transistor 49 further includes a gate electrode 30 arranged to extend from a part above the source region 28 to a part above the offset region 26 through intermediation of a gate insulating film (not shown).

The base region 25 has an impurity concentration higher than the impurity concentration of the semiconductor substrate 1, which is, for example, approximately $1 \times 10^{17}$ cm⁻³. The offset region 26 has an impurity concentration higher than the impurity concentration of the high-side n well 2 and lower than the impurity concentration of the first semiconductor region (cathode region) 22, which is, for example, approximately $1 \times 10^{17}$ cm⁻³. The drain region 27 and the source region 28 have an impurity concentration higher than the impurity concentration of the offset region 26, which is, for example, approximately from $1 \times 10^{20}$ cm⁻³ to $1 \times 10^{21}$ cm⁻³. The contact region 29 has an impurity concentration higher than the impurity concentration of the base region 25, which is, for example, approximately from $1 \times 10^{20}$ cm⁻³ to $1 \times 10^{21}$ cm⁻³. The output terminal LO is connected to the drain region 27. The ground terminal GND is connected to the source region 28 and the contact region 29.

Meanwhile, the pMOS transistor 48 includes an n-type third well region (low-side n well) 31 and a p-type offset region 32. The low-side n well 31 is provided in the upper part of the semiconductor substrate 1, and the offset region 32 is provided in an upper part of the low-side n well 31. The pMOS transistor 48 further includes a p⁺-type drain region 33 provided in an upper part of the offset region 32. The pMOS transistor 48 further includes a p⁺-type source region 34 and an n$^+$-type contact region 35. The source region 34 is provided to be separated from the offset region 32 in the upper part of the low-side n well 31, and the contact region 35 is provided to be brought into contact with the source region 34 in the upper part of the low-side n well 31. The pMOS transistor 48 further includes a gate electrode 36 arranged to extend from a part above the source region 34 to a part above the offset region 32 through intermediation of a gate insulating film (not shown).

The low-side n well 31 has an impurity concentration equal to or lower than the impurity concentration of the high-side n well 2, which is, for example, approximately $1 \times 10^{16}$ cm$^{-3}$. The offset region 32 has an impurity concentration of, for example, approximately $1 \times 10^{17}$ cm$^{-3}$. The drain region 33 and the source region 34 have an impurity concentration higher than the impurity concentration of the offset region 32, which is, for example, approximately from $1 \times 10^{20}$ cm$^{-3}$ to $1 \times 10^{21}$ cm$^{-3}$. The contact region 35 has an impurity concentration higher than the impurity concentration of the low-side n well 31, which is, for example, approximately from $1 \times 10^{20}$ cm$^{-3}$ to $1 \times 10^{21}$ cm$^{-3}$. The output terminal LO is connected to the drain region 33. The power supply terminal VCC is connected to the source region 34 and the contact region 35.

As described above, in the semiconductor integrated circuit according to the second embodiment, some semiconductor regions among the plurality of n-type semiconductor regions included in the low-side circuit area 102 have an impurity concentration higher than the impurity concentration of the high-side n well 2. Meanwhile, the remaining semiconductor regions among the plurality of n-type semiconductor regions have an impurity concentration equal to or lower than the impurity concentration of the high-side n well 2.

Specifically, as the plurality of n-type semiconductor regions included in the low-side circuit area 102, there are the n$^+$-type first semiconductor region (cathode region) 22, which implements the protection diode 70, the n$^+$-type source region 28, the n$^+$-type drain region 27, and the n-type offset region 26, which implement the nMOS transistor 49, and the n-type low-side n well 31 and the n$^+$-type contact region 35, which implement the pMOS transistor 48. Among those mentioned above, the n$^+$-type first semiconductor region (cathode region) 22, the n$^+$-type drain region 27, the n-type offset region 26, the n$^+$-type source region 28, and the n$^+$-type contact region 35 have the impurity concentration higher than the impurity concentration of the high-side n well 2. Meanwhile, the n-type low-side n well 31 has the impurity concentration equal to or lower than the impurity concentration of the high-side n well 2.

Meanwhile, similarly to the semiconductor integrated circuit according to the first embodiment, the pMOS transistor 45 and the nMOS transistor 46 of the high-side driving circuit 43 illustrated in FIG. 1 are provided in the high-side circuit area 101. Further, similarly to the semiconductor integrated circuit according to the first embodiment, the nMOS transistor 69 of the level shift circuit 42 illustrated in FIG. 1 is provided between the high-side circuit area 101 and the low-side circuit area 102. The configurations of the pMOS transistor 45, the nMOS transistor 46, and the nMOS transistor 69 are the same as those of the semiconductor integrated circuit according to the first embodiment, and hence the overlapping description therefor is omitted.

Figure 9:
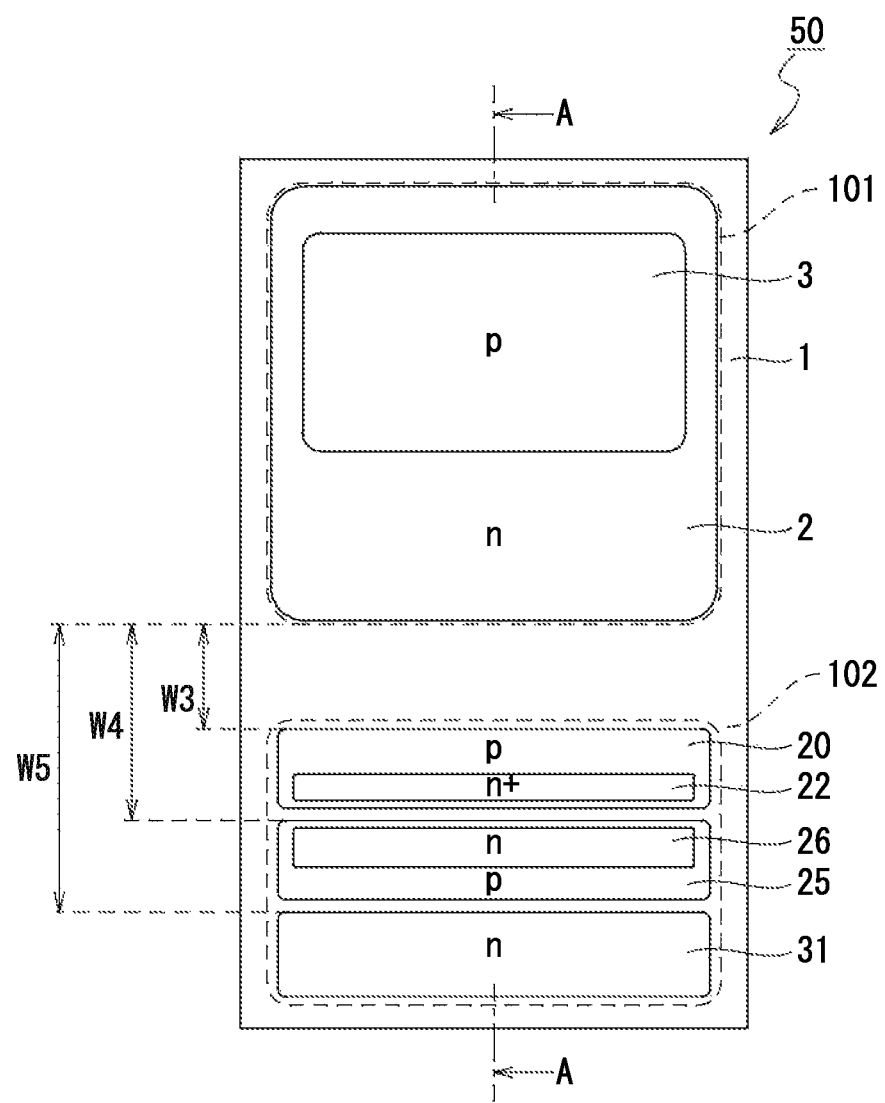
FIG. 9 is a plan view for illustrating the example of the semiconductor integrated circuit according to the second embodiment.

FIG. 9 is a schematic plan view of the semiconductor integrated circuit according to the second embodiment. A sectional view taken along the line A-A of FIG. 9 corresponds to FIG. 8. In FIG. 9, a plane pattern of the high-side n well 2 and the high-side p well 3 of the high-side circuit area 101 and a plane pattern of the p-type second semiconductor region 20, the n$^+$-type first semiconductor region (cathode region) 22, the p-type base region 25, the n-type offset region 26, and the n-type low-side n well 31 of the low-side circuit area 102 are schematically illustrated, and a plane pattern of the other regions is omitted.

As illustrated in FIG. 8 and FIG. 9, in the low-side circuit area 102 of the semiconductor integrated circuit according to the second embodiment, the p-type second semiconductor region 20 having the n$^+$-type first semiconductor region 22 provided in the upper part of the second semiconductor region 20 is arranged at a position closest to the high-side circuit area 101 while being separated from the high-side circuit area 101 by a distance W3. Further, the p-type base region 25 having the n-type offset region 26 provided in the upper part of the base region 25 is arranged at an intermediate position with respect to the high-side circuit area 101 while being separated from the high-side circuit area 101 by a distance W4. Further, the n-type low-side n well 31 is arranged at position farthest from the high-side circuit area 101 while being separated from the high-side circuit area 101 by a distance W5. For example, an area ratio of the p-type second semiconductor region 20 to the low-side circuit area 102 is approximately 15%. An area ratio of the p-type base region 25 to the low-side circuit area 102 is approximately 35%. An area ratio of the n-type low-side n well 31 to the low-side circuit area 102 is approximately 50%.

As illustrated in FIG. 8, in the semiconductor integrated circuit according to the second embodiment, similarly to the semiconductor integrated circuit according to the first embodiment, the parasitic p-n-p bipolar transistor 38 is formed by the high-side p well 3, the high-side n well 2, and the p-type semiconductor substrate 1. At the time of the normal operation of the semiconductor integrated circuit according to the second embodiment, the following case is assumed. That is, part of collector current of the parasitic p-n-p bipolar transistor 38 (indicated by the dashed-line arrow) arrives at the n$^+$-type first semiconductor region 22 forming the protection diode 70, and the parasitic diode D1, which is formed of the n$^+$-type first semiconductor region 22 and the p-type second semiconductor region 20, is turned into the on state. In this case, a first parasitic p-n-p-n thyristor, which is formed of the high-side p well 3, the high-side n well 2, the p$^-$-type semiconductor substrate 1, the p-type second semiconductor region 20, and the n$^+$-type first semiconductor region 22, is operated.

Further, at the time of the normal operation of the semiconductor integrated circuit according to the second embodiment, the following case is assumed. That is, part of collector current of the parasitic p-n-p bipolar transistor 38 (indicated by the dashed-line arrow) arrives at the n-type offset region 26 forming the nMOS transistor 49, and a parasitic diode D3, which is formed by the n-type offset region 26 and the p-type base region 25, is turned into an on state. In this case, a second parasitic p-n-p-n thyristor, which is formed by the high-side p well 3, the high-side n well 2, the p$^-$-type semiconductor substrate 1, the p-type base region 25, and the n-type offset region 26, is operated.

Further, at the time of the normal operation of the semiconductor integrated circuit according to the second embodiment, the following case is assumed. That is, part of collector current of the parasitic p-n-p bipolar transistor 38 (indicated by the dashed-line arrow) arrives at the n-type low-side n well 31 forming the pMOS transistor 48, and a parasitic diode D4, which is formed by the n-type low-side n well 31 and the p⁻-type semiconductor substrate 1, is turned into an on state. In this case, a third parasitic p-n-p-n thyristor, which is formed by the high-side p well 3, the high-side n well 2, the p⁻-type semiconductor substrate 1, and the n-type low-side n well 31, is operated.

Figure 10:
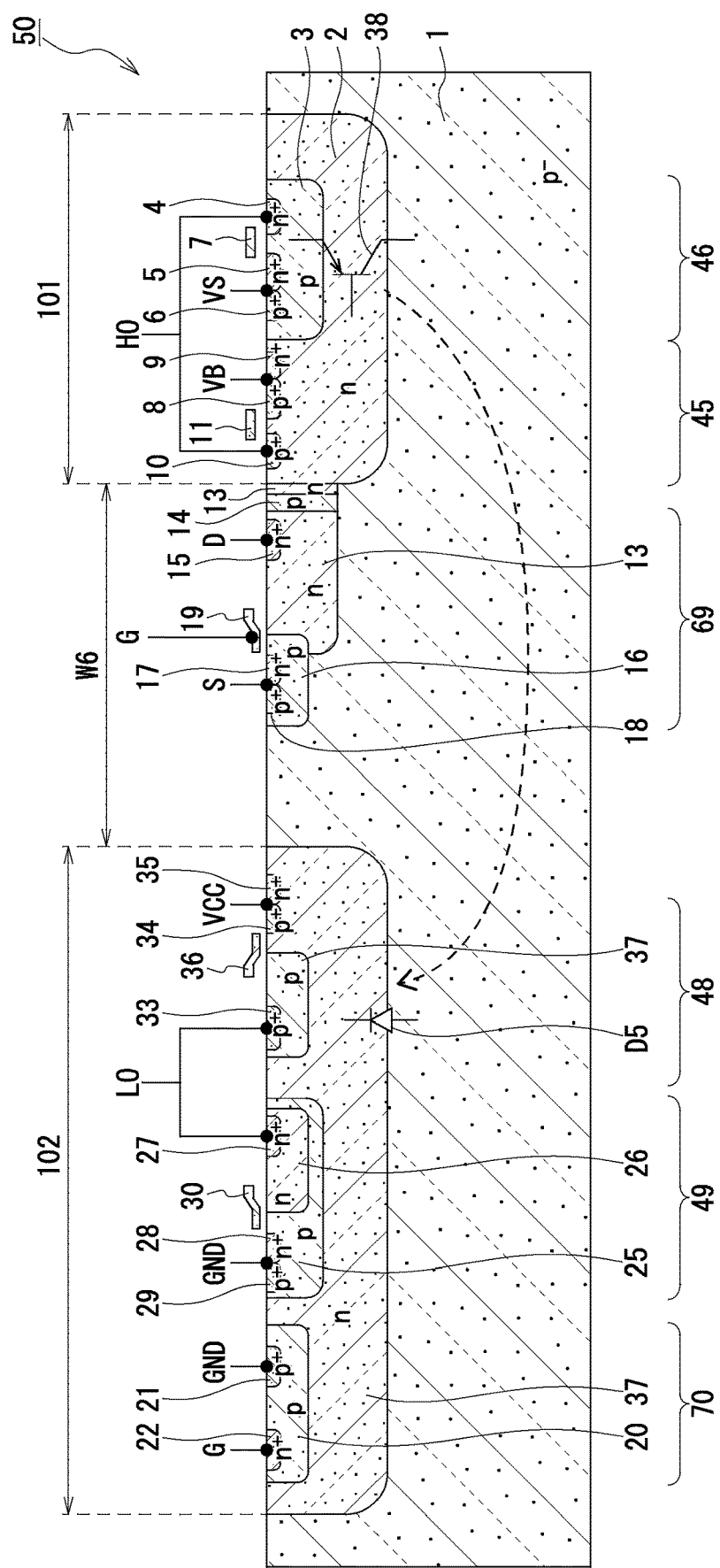
FIG. 10 is a sectional view for illustrating a semiconductor integrated circuit as a comparative example in the second embodiment.
Figure 11:
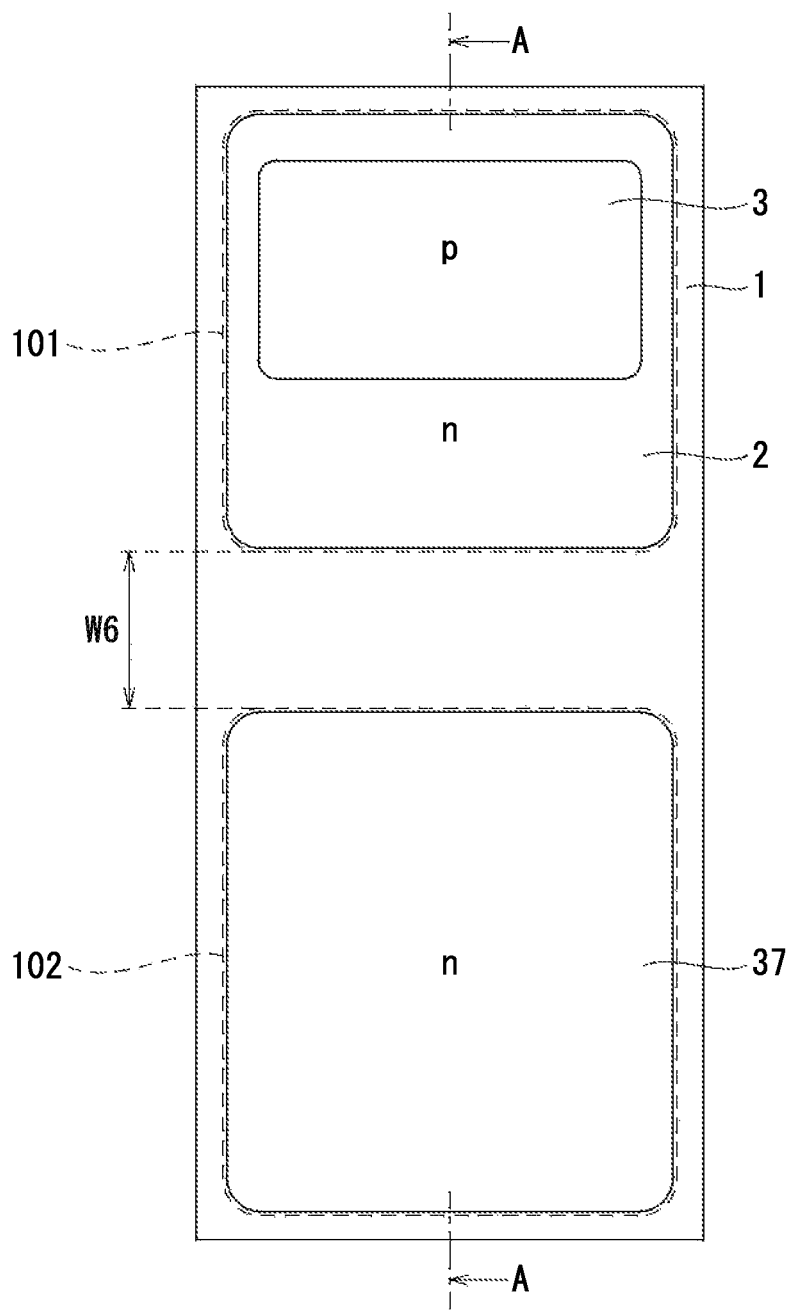
FIG. 11 is a plan view for illustrating the semiconductor integrated circuit as the comparative example in the second embodiment.

Here, in FIG. 10 and FIG. 11, a semiconductor integrated circuit as a comparative example in the second embodiment is illustrated. A sectional view taken along the line A-A in a plan view of FIG. 11 corresponds to FIG. 10. The semiconductor integrated circuit as the comparative example in the second embodiment is different from the semiconductor integrated circuit according to the second embodiment in that all the elements of the low-side circuit area 102 are provided in an n-type third well region (high-side n well) 37. The low-side n well 31 has the impurity concentration equal to or lower than the impurity concentration of the high-side n well 2, which is, for example, approximately $1\times10^{16}$ cm⁻³.

In the semiconductor integrated circuit as the comparative example in the second embodiment, similarly to the semiconductor integrated circuit according to the second embodiment, the parasitic p-n-p bipolar transistor 38 is formed by the high-side p well 3, the high-side n well 2, and the p⁻-type semiconductor substrate 1. The following case is assumed. That is, at the time of a normal operation of the semiconductor integrated circuit as the comparative example in the second embodiment, part of collector current of the parasitic p-n-p bipolar transistor 38 (indicated by the dashed-line arrow) arrives at the n-type low-side n well 31, and a parasitic diode D5, which is formed by the low-side n well 31 and the semiconductor substrate 1, is turned into an on state. In this case, a parasitic p-n-p-n thyristor, which is formed of the high-side p well 3, the high-side n well 2, the p⁻-type semiconductor substrate 1, and the n-type low-side n well 31, is operated.

In the semiconductor integrated circuit as the comparative example in the second embodiment, all the elements of the low-side circuit area 102 are provided in the high-side n well 37. In view of this, built-in potential of the parasitic diode D5 is the same as built-in potential of the parasitic diode D4 of the semiconductor integrated circuit according to the second embodiment, and is lower than built-in potential of the parasitic diodes D1 and D3 of the semiconductor integrated circuit according to the second embodiment. In order to prevent the parasitic diode D5 from being turned into the on state, it is required to separate the high-side n well 37 from the high-side n well 2 to reduce an amount of current arriving at the high-side n well 37 from the parasitic p-n-p bipolar transistor 38. Therefore, as illustrated in FIG. 10 and FIG. 11, a distance W6 between the high-side circuit area 101 and the low-side circuit area 102 is increased. Accordingly, the chip area is increased.

In contrast, with the semiconductor integrated circuit according to the second embodiment, as illustrated in FIG. 8 and FIG. 9, some elements of the plurality of elements included in the low-side circuit area 102 are provided without the n-type low-side n well 31, and the remaining elements are provided through use of the n-type low-side n well 31. Further, the impurity concentration is high in the order of the n⁺-type first semiconductor region 22 forming the protection diode 70, the n-type offset region 26 forming the nMOS transistor 49, and the n-type low-side n well 31 forming the pMOS transistor 48. In view of this, the built-in potential is high in the order of the parasitic diodes D1, D3, and D4. Also, the parasitic diodes D1, D3, and D4, are less liable to be turned into the on state in the stated order.

In view of the above, in the semiconductor integrated circuit according to the second embodiment, as illustrated in FIG. 8 and FIG. 9, the p-type second semiconductor region 20 having the n⁺-type first semiconductor region 22 provided in the upper part of the second semiconductor region 20, the p-type base region 25 having the n-type offset region 26 provided in the upper part of the base region 25, and the n-type low-side n well 31 are arranged so as to be away from the high-side circuit area 101 in the stated order. With this structure, the operations of the first to third parasitic p-n-p-n thyristors can be suppressed. Moreover, the n-type low-side n well 31 is required to be away from the certain distance W5 from the high-side circuit area 101. However, the p-type second semiconductor region 20 and the n-type offset region 26 other than the n-type low-side n well 31 can be arranged between the n-type low-side n well 31 and the high-side circuit area 101. Accordingly, the chip area can be reduced. Therefore, the operation of the parasitic p-n-p-n thyristor can be suppressed with a smaller chip area while suppressing increase of process cost.

Note that, in the second embodiment, there is exemplified the case where the low-side circuit area 102 includes the three element forming areas, which are the p-type second semiconductor region 20, the p-type base region 25, and the n-type low-side n well 31, but the present invention is not limited the three element forming areas. For example, the low-side circuit area 102 may not include the p-type base region 25, and may include only the two regions, which are the p-type second semiconductor region 20 and the n-type low-side n well 31. Alternatively, the low-side circuit area 102 may not include the p-type second semiconductor region 20, and may include only the p-type base region 25 and the n-type low-side n well 31. Moreover, the low-side circuit area 102 may include four or more element forming areas each forming a parasitic p-n-p-n thyristor and having a parasitic diode having different built-in potential. In this case, the element forming areas may be arranged at positions closer to the high-side circuit area 101 in the descending order of the built-in potential of the parasitic diodes.

Third Embodiment

Figure 12:
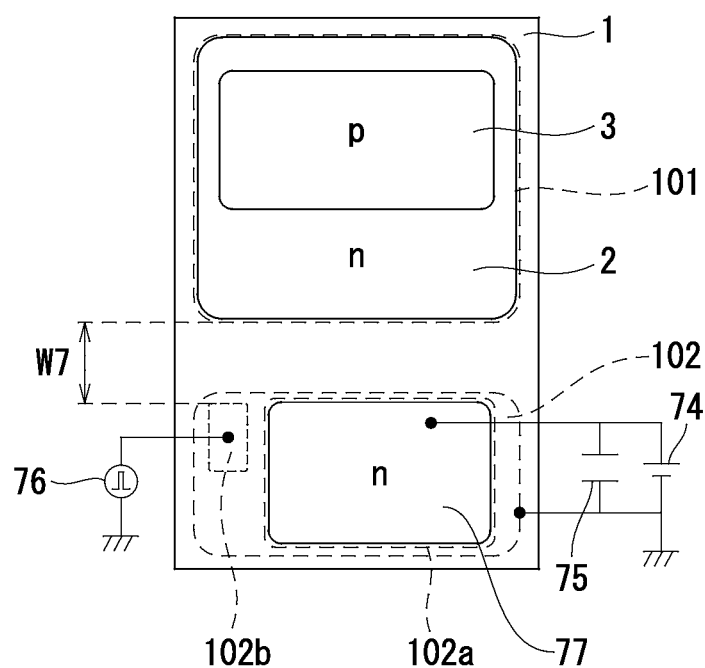
FIG. 12 is a plan view for illustrating an example of a semiconductor integrated circuit according to a third embodiment of the present invention.

A circuit structure of a semiconductor integrated circuit according to a third embodiment of the present invention is the same as the circuit structure of the semiconductor integrated circuit according to the embodiment illustrated in FIG. 1. As illustrated in FIG. 12, the semiconductor integrated circuit according to the third embodiment includes the high-side circuit area 101 and the low-side circuit area 102 on one chip. The high-side circuit area 101 is operated with the VS potential as reference potential. The low-side circuit area 102 is operated with the GND potential as reference potential. The structure of the high-side circuit area 101 is the same as that of the high-side circuit area 101 of the semiconductor integrated circuit according to the first embodiment, which is illustrated in FIG. 2, and hence the overlapping description therefor is omitted.

The low-side circuit area 102 includes two regions, which are a first element forming area 102a and a second element forming area 102b arranged so to be separated from the first element forming area 102a. The first element forming area 102a includes an element, which can be always applied with potential (for example, the VCC potential) higher than substrate potential (for example, the GND potential). The element included in the first element forming area 102a is formed through use of an n-type third well region (low-side n well) 77. A positive side of a power supply 74 is connected to the low-side n well 77 of the first element forming area 102a. A negative side of the power supply 74 is connected to the semiconductor substrate 1. A capacitor 75 for absorbing surge current is connected in parallel to the power supply 74. The first element forming area 102a can be always applied with the VCC potential higher than the GND potential, and hence the operation of the parasitic p-n-p-n thyristor can be suppressed.

Meanwhile, the second element forming area 102b includes an element, which cannot be always applied with the potential (the VCC potential) higher the substrate potential (the GND potential). That is, the element included in the second element forming area 102b is prevented from being always applied with the potential (the VCC potential) higher the substrate potential (the GND potential). The element included in the second element forming area 102b is formed without the n-type third well region (low-side n well). Specifically, the impurity concentration of the whole n-type semiconductor region of the second element forming area 102b is higher than the impurity concentration of the high-side n well 2. A pulse power supply 76 is connected to the n-type conductor region of the second element forming area 102b. There is a timing when the potential of the second element forming area 102b becomes the same as the GND potential. Thus, it can be regarded that the VCC potential higher than the GND potential cannot be always applied.

For example, the second element forming area 102b includes the protection diode 70 illustrated in FIG. 2. The protection diode 70 includes the p-type second semiconductor region (drift region) 20, the p$^+$-type anode region 21, and the n$^+$-type first semiconductor region (cathode region) 22. The drift region 20 is provided in the upper part of the semiconductor substrate 1, and the p$^+$-type anode region 21 and the first semiconductor region (cathode region) 22 are provided across the second semiconductor region 20 in the upper part of the second semiconductor region 20. The first semiconductor region (cathode region) 22 has the impurity concentration higher than the impurity concentration of the high-side n well 2.

Figure 13:
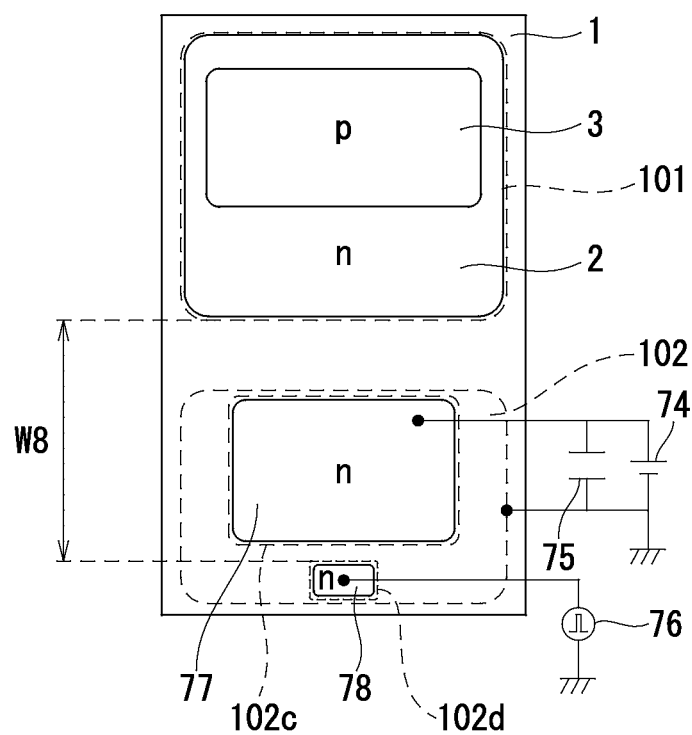
FIG. 13 is a plan view for illustrating a semiconductor integrated circuit as a comparative example in the third embodiment.

Here, a semiconductor integrated circuit as a comparative example in the third embodiment is illustrated in FIG. 13. The low-side circuit area 102 of the semiconductor integrated circuit as the comparative example in the third embodiment includes two regions, which are a first element forming area 102c and a second element forming area 102d. Similarly to the first element forming area 102a of the semiconductor integrated circuit according to the third embodiment, the first element forming area 102c includes an element, which can be applied with potential (the VCC potential) higher than the substrate potential (the GND potential). Similarly to the first element forming area 102a, the first element forming area 102c is formed through use of the third well region (low-side n well) 77.

Similarly to the second element forming area 102b of the semiconductor integrated circuit according to the third embodiment, the second element forming area 102d includes an element, which cannot be always applied with the potential (the VCC potential) higher than the ground potential (the GND potential). The second element forming area 102d is different from the second element forming area 102b in that the second element forming area 102d is formed through use of a fourth well region (low-side n well) 78. The second element forming area 102d cannot be always applied with the potential (the VCC potential) higher than the substrate potential (the GND potential), and the parasitic p-n-p-n thyristor is liable to be operated. In view of this, the second element forming area 102d is required to be arranged so as to be separated from the high-side circuit area 101. As a result, a distance W8 is increased between the high-side circuit area 101 and the second element forming area 102d. Accordingly, the chip area is increased.

In contrast, with the semiconductor integrated circuit according to the third embodiment, as illustrated in FIG. 12, in the first element forming area 102a, the element is selectively formed through use of the low-side n well 77. Meanwhile, in the second element forming area 102b, without the low-side n well, the impurity concentration of the whole n-type semiconductor region included in the second element forming area 102b is higher than the impurity concentration of the high-side n well 2. With this, as compared to the case of the semiconductor integrated circuit as the comparative example in the third embodiment in which the low-side n well is used, the parasitic diode formed by the n-type semiconductor region included in the second element forming area 102b is less liable to be turned into the on state. Therefore, the second element forming area 102b can be arranged closed to the high-side circuit area 101, and hence the distance W7 the second element forming area 102b and the high-side circuit area 101 can be reduced. Accordingly, the chip are can be reduced.

Note that, in FIG. 12, the first element forming area 102a and the second element forming area 102b are arranged so as to be away from the high-side circuit area 101 by the constant distance W7. However, the second element forming area 102b may be arranged closer to the high-side circuit area 101 as compared to the first element forming area 102a. Alternatively, the second element forming area 102b may be arranged between the high-side circuit area 101 and the first element forming area 102a.

Other Embodiments

As described above, the description is made of the present invention according to the first embodiment to the third embodiment. However, it should not be understood that the statement and the drawings forming a part of this discloser limit the present invention. Based on this discloser, various alternative embodiment, examples, and operation technologies may be obvious to a person skilled in the art.

Figure 14:
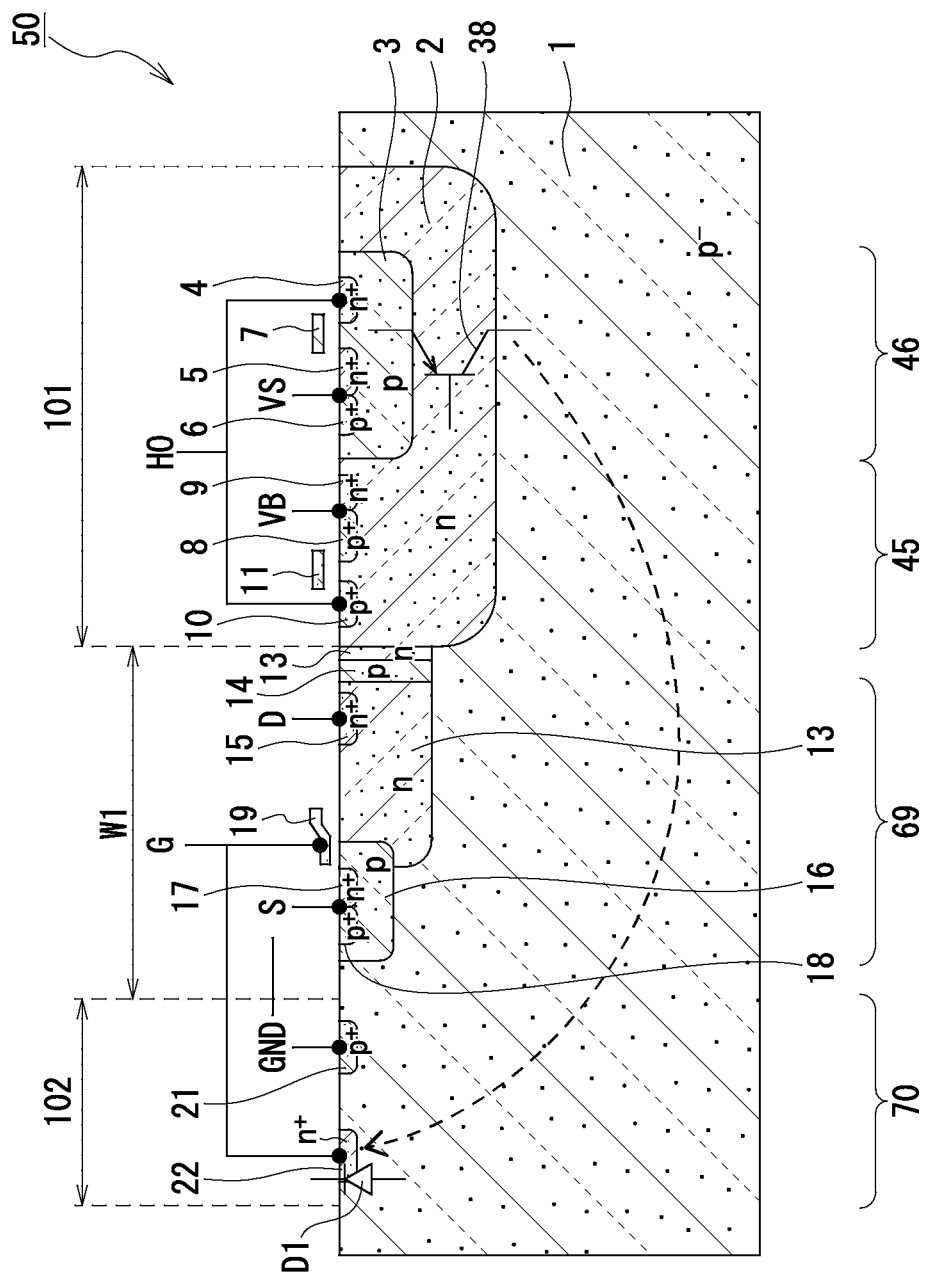
FIG. 14 is a sectional view for illustrating a semiconductor integrated circuit according to other embodiments of the present invention.

For example, the first embodiment and the second embodiment, as illustrated in FIG. 2 and FIG. 8, there is exemplified the case where, in the low-side circuit area 102, the protection diode 70 includes the p-type second semiconductor region (drift region) 20. However, as illustrated in FIG. 14, the protection diode 70 may not include the p-type second semiconductor region (drift region) 20. In this case, the p$^+$-type anode region 21 and the n$^+$-type first semiconductor region (cathode region) 22 are brought into contact with the semiconductor substrate 1.

Further, in the first embodiment, as illustrated in FIG. 2, there is exemplified the case where the high-side circuit area 101 includes the pMOS transistor 45 and the nMOS transistor 46, but the elements included in the high-side circuit area 101 are not limited to the pMOS transistor 45 and the nMOS transistor 46. For example, the high-side circuit area 101 may further include other elements, which can be formed in the high-side n well 2.

Further, in the first embodiment, as illustrated in FIG. 2, there is exemplified the case where the low-side circuit area 102 includes only the protection diode 70. However, as long as the whole n-type semiconductor region forming the element included in the low-side circuit area 102 have the impurity concentration higher than the impurity concentration of the high-side n well 2, the element included in the low-side circuit area 102 is not limited to the protection diode 70. For example, the low-side circuit area 102 may further include other elements different from the protection diode 70, and may include only other elements without the protection diode 70. Further, the nMOS transistor 49 illustrated in FIG. 8 is further formed in the low-side circuit area 102 illustrated in FIG. 2. In this case, as the n-type semiconductor regions included in the low-side circuit area 102, all the n-type offset region 26, the n$^+$-type drain region 27, and the n$^+$-type source region 28, which form the nMOS transistor 49, have the impurity concentration higher than the impurity concentration of the high-side n well 2.

Further, the pMOS transistor 48 illustrated in FIG. 8 may be formed in the low-side circuit area 102 illustrated in FIG. 2 without the low-side n well region 31 but through use of the n-type semiconductor region having the impurity concentration higher than the impurity concentration of the high-side n well 2. Further, the pMOS transistor and the n MOS transistor of the input control circuit 41 illustrated in FIG. 1 may be formed without the low-side n well region but through use of the n-type semiconductor region having the impurity concentration higher than the impurity concentration of the high-side n well 2.

Further, as illustrated in FIG. 2, there is exemplified the case where the nMOS transistor 69 of the level shift circuit 42 illustrated in FIG. 1 is provided between the high-side circuit area 101 and the low-side circuit area 102, but the structure may not include the nMOS transistor 69.

Further, in the second embodiment, as illustrated in FIG. 8, there is exemplified the case where the low-side circuit area 102 includes the protection diode 70, the pMOS transistor 48, and the nMOS transistor 49. However, the elements included in the low-side circuit area 102 are not limited to the protection diode 70, the pMOS transistor 48, and the nMOS transistor 49. For example, the structure may not include the protection diode 70 or the nMOS transistor 49. Specifically, it is only required that the element formed without the low-side n well be arranged on a side relatively close to the high-side circuit area 101, and that the element formed through use of the low-side n well be arranged on a side relatively far from the high-side circuit area 101.

Further, in the first embodiment to the third embodiment, there are exemplified the cathode region 22 as the first semiconductor region and the drift region 20 as the second semiconductor region. However, those are merely examples. Specifically, the n-type first semiconductor region forms a part of the elements included in the low-side circuit area 102, and forms the parasitic thyristor together with the high-side p well 3, the high-side n well 2, and the p$^-$-type semiconductor substrate 1. A diode (for example, the protection diode 70 illustrated in FIG. 1) may be formed in the first semiconductor region as the main electrode region (the anode region or the cathode region), and an MOSFET (for example, the nMOS transistor 49 in FIG. 8) may be formed in the first semiconductor region as the main electrode region (the source region or the drain region). Further, the second semiconductor region forms a part of the elements included in the low-side circuit area 102, and forms a parasitic diode causing the parasitic p-n-p-n thyristor operation together with the first semiconductor region.

Further, in the first embodiment to the third embodiment, there is exemplified the semiconductor integrated circuit using a Si wafer as the semiconductor substrate 1, but this is merely an example. The technical ideas described in the first embodiment to the third embodiment are applicable to a semiconductor integrated circuit using a compound semiconductor formed of, for example, gallium arsenic (GaAs). Moreover, the technical ideas described in the first embodiment to the third embodiment are also applicable to a semiconductor integrated circuit using a wide band-gap semiconductor formed of, for example, SiC, gallium nitride (GaN), or diamond, and also applicable to a semiconductor integrated circuit using a narrow gap semiconductor formed of, for example, indium antimonide (InSb).

What is claimed is:

1. A semiconductor integrated circuit, comprising:
a semiconductor substrate having a first conductivity type;
a first well region having a second conductivity type, which is provided in an upper part of the semiconductor substrate in a high-potential side circuit area defined in the semiconductor substrate;
a second well region having the first conductivity type, which is provided in an upper part of the first well region and has an impurity concentration higher than an impurity concentration of the semiconductor substrate; and
a first semiconductor region having the second conductivity type, which is provided in a low-potential side circuit area, the low-potential side circuit area being separated from the high-potential side circuit area to be defined in the semiconductor substrate and being operated with potential as a reference, which is lower than reference potential of the high-potential side circuit area,
wherein a whole semiconductor region having the second conductivity type, which includes the first semiconductor region, has an impurity concentration higher than an impurity concentration of the first well region.

2. The semiconductor integrated circuit of claim 1, further comprising a second semiconductor region having the first conductivity type provided in the upper part of the semiconductor substrate in the low-potential side circuit area,
wherein the first semiconductor region is provided in an upper part of the second semiconductor region, and is brought into contact with the second semiconductor region.

3. The semiconductor integrated circuit of claim 1, wherein the first semiconductor region is brought into contact with the semiconductor substrate.

4. The semiconductor integrated circuit of claim 1, wherein a diode is provided through use of the first semiconductor region as a main electrode region.

5. The semiconductor integrated circuit of claim 1, wherein a MOSFET is provided through use of the first semiconductor region as the main electrode region.

* * * * *